United States Patent
Shero et al.

(10) Patent No.: US 9,394,608 B2
(45) Date of Patent: Jul. 19, 2016

(54) SEMICONDUCTOR PROCESSING REACTOR AND COMPONENTS THEREOF

(75) Inventors: Eric Shero, Phoenix, AZ (US); Mohith E. Verghese, Phoenix, AZ (US); Carl L. White, Gilbert, AZ (US); Herbert Terhorst, Amersfoort (NL); Dan Maurice, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 684 days.

(21) Appl. No.: 12/754,223

(22) Filed: Apr. 5, 2010

(65) Prior Publication Data

US 2010/0307415 A1 Dec. 9, 2010

Related U.S. Application Data

(60) Provisional application No. 61/167,093, filed on Apr. 6, 2009.

(51) Int. Cl.
 *C23C 16/455* (2006.01)

(52) U.S. Cl.
 CPC ..... *C23C 16/45544* (2013.01); *C23C 16/45502* (2013.01); *C23C 16/45504* (2013.01); *C23C 16/45525* (2013.01); *C23C 16/45561* (2013.01); *C23C 16/45591* (2013.01); *Y10T 137/85938* (2015.04)

(58) Field of Classification Search
 CPC ............... C23C 16/45502; C23C 16/45544; C23C 16/45504; C23C 16/45525; C23C 16/45561; C23C 16/45591
 See application file for complete search history.

(56) References Cited

U.S. PATENT DOCUMENTS

| D56,051 S | 8/1920 | Cohn |
|---|---|---|
| 2,161,626 A | 6/1939 | Loughner et al. |
| 2,745,640 A | 5/1956 | Cushman |
| 2,990,045 A | 9/1959 | Root |

(Continued)

FOREIGN PATENT DOCUMENTS

| CN | 1563483 A | 12/2006 |
|---|---|---|
| CN | 101330015 | 12/2008 |

(Continued)

OTHER PUBLICATIONS

The International Search Report and Written Opinion from the corresponding International Application No. PCT/US2010/030126 dated Nov. 12, 2010.

(Continued)

*Primary Examiner* — Jeffrie R Lund
*Assistant Examiner* — Yuechuan Yu
(74) *Attorney, Agent, or Firm* — Snell & Wilmer LLP

(57) ABSTRACT

A reactor having a housing that encloses a gas delivery system operatively connected to a reaction chamber and an exhaust assembly. The gas delivery system includes a plurality of gas lines for providing at least one process gas to the reaction chamber. The gas delivery system further includes a mixer for receiving the at least one process gas. The mixer is operatively connected to a diffuser that is configured to diffuse process gases. The diffuser is attached directly to an upper surface of the reaction chamber, thereby forming a diffuser volume therebetween. The diffuser includes at least one distribution surface that is configured to provide a flow restriction to the process gases as they pass through the diffuser volume before being introduced into the reaction chamber.

15 Claims, 15 Drawing Sheets

(56) References Cited

U.S. PATENT DOCUMENTS

| | | | |
|---|---|---|---|
| 3,089,507 A | 5/1963 | Drake et al. | |
| 3,833,492 A | 9/1974 | Bollyky | |
| 3,854,443 A | 12/1974 | Baerg | |
| 3,862,397 A | 1/1975 | Anderson et al. | |
| 3,887,790 A | 6/1975 | Ferguson | |
| 4,054,071 A | 10/1977 | Patejak | |
| 4,058,430 A | 11/1977 | Suntola et al. | |
| 4,134,425 A | 1/1979 | Gussefeld et al. | |
| 4,145,699 A | 3/1979 | Hu et al. | |
| 4,176,630 A | 12/1979 | Elmer | |
| 4,181,330 A | 1/1980 | Kojima | |
| 4,194,536 A | 3/1980 | Stine et al. | |
| 4,322,592 A | 3/1982 | Martin | |
| 4,389,973 A | 6/1983 | Suntola et al. | |
| 4,393,013 A | 7/1983 | McMenamin | |
| 4,401,507 A | 8/1983 | Engle | |
| 4,414,492 A | 11/1983 | Hanlet | |
| 4,436,674 A | 3/1984 | McMenamin | |
| 4,499,354 A | 2/1985 | Hill et al. | |
| 4,512,113 A | 4/1985 | Budinger | |
| 4,570,328 A | 2/1986 | Price et al. | |
| 4,579,623 A | 4/1986 | Suzuki et al. | |
| D288,556 S | 3/1987 | Wallgren | |
| 4,653,541 A | 3/1987 | Oehlschlaeger et al. | |
| 4,654,226 A | 3/1987 | Jackson et al. | |
| 4,681,134 A | 7/1987 | Paris | |
| 4,718,637 A | 1/1988 | Contin | |
| 4,722,298 A | 2/1988 | Rubin et al. | |
| 4,735,259 A | 4/1988 | Vincent | |
| 4,753,192 A | 6/1988 | Goldsmith et al. | |
| 4,780,169 A | 10/1988 | Stark et al. | |
| 4,789,294 A | 12/1988 | Sato et al. | |
| 4,821,674 A | 4/1989 | deBoer et al. | |
| 4,827,430 A | 5/1989 | Aid et al. | |
| 4,837,185 A | 6/1989 | Yau et al. | |
| 4,854,263 A | 8/1989 | Chang et al. | |
| 4,857,137 A | 8/1989 | Tachi et al. | |
| 4,857,382 A | 8/1989 | Liu et al. | |
| 4,882,199 A | 11/1989 | Sadoway et al. | |
| 4,985,114 A | 1/1991 | Okudaira | |
| 4,986,215 A | 1/1991 | Yamada | |
| 4,987,856 A | 1/1991 | Hey | |
| 4,991,614 A | 2/1991 | Hammel | |
| 5,013,691 A | 5/1991 | Lory et al. | |
| 5,028,366 A | 7/1991 | Harakal et al. | |
| 5,060,322 A | 10/1991 | Delepine | |
| 5,062,386 A | 11/1991 | Christensen | |
| 5,074,017 A | 12/1991 | Toya et al. | |
| 5,116,018 A | 5/1992 | Friemoth et al. | |
| D327,534 S | 6/1992 | Manville | |
| 5,119,760 A | 6/1992 | McMillan et al. | |
| 5,167,716 A | 12/1992 | Boitnott et al. | |
| 5,178,682 A | 1/1993 | Tsukamoto et al. | |
| 5,183,511 A | 2/1993 | Yamazaki et al. | |
| 5,192,717 A | 3/1993 | Kawakami | |
| 5,194,401 A | 3/1993 | Adams et al. | |
| 5,199,603 A | 4/1993 | Prescott | |
| 5,221,556 A * | 6/1993 | Hawkins et al. | 427/255.17 |
| 5,242,539 A | 9/1993 | Kumihashi et al. | |
| 5,243,195 A | 9/1993 | Nishi | |
| 5,288,684 A | 2/1994 | Yamazaki et al. | |
| 5,306,946 A | 4/1994 | Yamamoto | |
| 5,326,427 A | 7/1994 | Jerbic | |
| 5,354,580 A | 10/1994 | Goela et al. | |
| 5,356,478 A | 10/1994 | Chen et al. | |
| 5,380,367 A | 1/1995 | Bertone | |
| 5,382,311 A | 1/1995 | Ishikawa et al. | |
| 5,404,082 A | 4/1995 | Hernandez et al. | |
| 5,415,753 A | 5/1995 | Hurwitt et al. | |
| 5,421,893 A | 6/1995 | Perlov | |
| 5,422,139 A | 6/1995 | Fischer | |
| 5,430,011 A | 7/1995 | Tanaka et al. | |
| 5,494,494 A | 2/1996 | Mizuno et al. | |
| 5,496,408 A | 3/1996 | Motoda et al. | |
| 5,504,042 A | 4/1996 | Cho et al. | |
| 5,518,549 A | 5/1996 | Hellwig | |
| 5,527,417 A | 6/1996 | Iida et al. | |
| 5,531,835 A | 7/1996 | Fodor et al. | |
| 5,574,247 A | 11/1996 | Nishitani et al. | |
| 5,589,002 A | 12/1996 | Su | |
| 5,589,110 A | 12/1996 | Motoda et al. | |
| 5,595,606 A | 1/1997 | Fujikawa et al. | |
| 5,601,641 A | 2/1997 | Stephens | |
| 5,604,410 A | 2/1997 | Vollkommer et al. | |
| 5,616,947 A | 4/1997 | Tamura | |
| 5,632,919 A | 5/1997 | MacCracken et al. | |
| D380,527 S | 7/1997 | Velez | |
| 5,679,215 A | 10/1997 | Barnes et al. | |
| 5,681,779 A | 10/1997 | Pasch et al. | |
| 5,683,517 A | 11/1997 | Shan | |
| 5,695,567 A | 12/1997 | Kordina | |
| 5,718,574 A | 2/1998 | Shimazu | |
| 5,728,223 A | 3/1998 | Murakami et al. | |
| 5,730,801 A | 3/1998 | Tepman | |
| 5,732,744 A | 3/1998 | Barr et al. | |
| 5,736,314 A | 4/1998 | Hayes et al. | |
| 5,781,693 A | 7/1998 | Ballance et al. | |
| 5,796,074 A | 8/1998 | Edelstein et al. | |
| 5,801,104 A | 9/1998 | Schuegraf et al. | |
| 5,819,434 A | 10/1998 | Herchen et al. | |
| 5,827,757 A | 10/1998 | Robinson, Jr. et al. | |
| 5,836,483 A | 11/1998 | Disel | |
| 5,837,320 A | 11/1998 | Hampden-Smith et al. | |
| 5,853,484 A | 12/1998 | Jeong | |
| 5,855,680 A | 1/1999 | Soininen et al. | |
| 5,855,681 A | 1/1999 | Maydan et al. | |
| 5,873,942 A | 2/1999 | Park | |
| 5,877,095 A | 3/1999 | Tamura et al. | |
| 5,908,672 A | 6/1999 | Ryu | |
| 5,916,365 A | 6/1999 | Sherman | |
| 5,920,798 A | 7/1999 | Higuchi et al. | |
| 5,968,275 A | 10/1999 | Lee et al. | |
| 5,975,492 A | 11/1999 | Brenes | |
| 5,979,506 A | 11/1999 | Aarseth | |
| 5,997,588 A | 12/1999 | Goodwin | |
| D419,652 S | 1/2000 | Hall et al. | |
| 6,013,553 A | 1/2000 | Wallace | |
| 6,015,465 A | 1/2000 | Kholodenko et al. | |
| 6,017,779 A | 1/2000 | Miyasaka | |
| 6,024,799 A | 2/2000 | Chen | |
| 6,035,101 A | 3/2000 | Sajoto et al. | |
| 6,042,652 A | 3/2000 | Hyun | |
| 6,044,860 A | 4/2000 | Nue | |
| 6,050,506 A | 4/2000 | Guo et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,099,302 A | 8/2000 | Hong et al. | |
| 6,122,036 A | 9/2000 | Yamasaki et al. | |
| 6,124,600 A | 9/2000 | Moroishi et al. | |
| 6,125,789 A | 10/2000 | Gupta et al. | |
| 6,129,044 A | 10/2000 | Zhao et al. | |
| 6,137,240 A | 10/2000 | Bogdan et al. | |
| 6,140,252 A | 10/2000 | Cho et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,162,323 A | 12/2000 | Koshimizu et al. | |
| 6,180,979 B1 | 1/2001 | Hofman et al. | |
| 6,187,691 B1 | 2/2001 | Fukuda | |
| 6,194,037 B1 | 2/2001 | Terasaki et al. | |
| 6,201,999 B1 | 3/2001 | Jevtic | |
| 6,207,932 B1 | 3/2001 | Yoo | |
| 6,250,250 B1 | 6/2001 | Maishev et al. | |
| 6,271,148 B1 | 8/2001 | Kao | |
| 6,274,878 B1 | 8/2001 | Li et al. | |
| 6,287,965 B1 | 9/2001 | Kang et al. | |
| D449,873 S | 10/2001 | Bronson | |
| 6,296,909 B1 | 10/2001 | Spitsberg | |
| 6,299,133 B2 | 10/2001 | Waragai et al. | |
| 6,302,964 B1 | 10/2001 | Umotoy et al. | |
| 6,303,523 B2 | 10/2001 | Cheung | |
| 6,305,898 B1 | 10/2001 | Yamagishi et al. | |

(56) References Cited

U.S. PATENT DOCUMENTS

| | | |
|---|---|---|
| 6,312,525 B1 | 11/2001 | Bright et al. |
| 6,315,512 B1 | 11/2001 | Tabrizi et al. |
| D451,893 S | 12/2001 | Robson |
| D452,220 S | 12/2001 | Robson |
| 6,326,597 B1 | 12/2001 | Lubomirsky et al. |
| 6,329,297 B1 | 12/2001 | Balish |
| 6,342,427 B1 | 1/2002 | Choi et al. |
| 6,347,636 B1 | 2/2002 | Xia |
| 6,352,945 B1 | 3/2002 | Matsuki |
| 6,367,410 B1 | 4/2002 | Leahey et al. |
| 6,368,987 B1 | 4/2002 | Kopacz et al. |
| 6,370,796 B1 | 4/2002 | Zucker |
| 6,374,831 B1 | 4/2002 | Chandran |
| 6,375,312 B1 | 4/2002 | Ikeda et al. |
| D457,609 S | 5/2002 | Piano |
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,435,798 B1 | 8/2002 | Satoh |
| 6,436,819 B1 | 8/2002 | Zhang |
| 6,437,444 B2 | 8/2002 | Andideh |
| 6,446,573 B2 | 9/2002 | Hirayama et al. |
| 6,450,757 B1 | 9/2002 | Saeki |
| 6,454,860 B2 | 9/2002 | Metzner et al. |
| 6,455,445 B2 | 9/2002 | Matsuki |
| 6,461,435 B1 | 10/2002 | Littau et al. |
| 6,468,924 B2 | 10/2002 | Lee |
| 6,472,266 B1 | 10/2002 | Yu et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Bucklund |
| 6,483,989 B1 | 11/2002 | Okada et al. |
| 6,499,533 B2 | 12/2002 | Yamada |
| 6,503,562 B1 | 1/2003 | Saito et al. |
| 6,503,826 B1 | 1/2003 | Oda |
| 6,511,539 B1 | 1/2003 | Raaijmakers |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,395 B2 | 3/2003 | Werkhoven et al. |
| 6,569,239 B2 | 5/2003 | Arai et al. |
| 6,573,030 B1 | 6/2003 | Fairbairn et al. |
| 6,576,062 B2 | 6/2003 | Matsuse |
| 6,576,064 B2 | 6/2003 | Griffiths et al. |
| 6,576,300 B1 | 6/2003 | Berry et al. |
| 6,579,833 B1 | 6/2003 | McNallan et al. |
| 6,583,048 B1 | 6/2003 | Vincent et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 | 10/2003 | Deng et al. |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki |
| 6,709,989 B2 | 3/2004 | Ramdani et al. |
| 6,710,364 B2 | 3/2004 | Guldi et al. |
| 6,716,571 B2 | 4/2004 | Gabriel |
| 6,730,614 B1 | 5/2004 | Lim et al. |
| 6,734,090 B2 | 5/2004 | Agarwala et al. |
| 6,740,853 B1 | 5/2004 | Johnson et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,318 B2 | 6/2004 | Nguyen et al. |
| 6,759,098 B2 | 7/2004 | Han |
| 6,784,108 B1 | 8/2004 | Donohoe et al. |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,480 B1 | 4/2005 | Ismailov |
| 6,875,677 B1 | 4/2005 | Conley, Jr. et al. |
| 6,876,017 B2 | 4/2005 | Goodner |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Alyward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,796 B2 | 7/2005 | Albano et al. |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,951,587 B1 | 10/2005 | Narushima |
| 6,953,609 B2 | 10/2005 | Carollo |
| 6,955,836 B2 | 10/2005 | Kumagai et al. |
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,246 B2 | 4/2007 | MacNeil et al. |

(56) References Cited

U.S. PATENT DOCUMENTS

| | | | |
|---|---|---|---|
| 7,205,247 | B2 | 4/2007 | Lee et al. |
| 7,207,763 | B2 | 4/2007 | Lee |
| 7,208,389 | B1 | 4/2007 | Tipton et al. |
| 7,211,524 | B2 | 5/2007 | Ryu et al. |
| 7,234,476 | B2 | 6/2007 | Arai |
| 7,235,137 | B2 | 6/2007 | Kitayama et al. |
| 7,235,482 | B2 | 6/2007 | Wu |
| 7,235,501 | B2 | 6/2007 | Ahn et al. |
| 7,238,596 | B2 | 7/2007 | Kouvetakis et al. |
| 7,265,061 | B1 | 9/2007 | Cho et al. |
| D553,104 | S | 10/2007 | Oohashi et al. |
| 7,290,813 | B2 | 11/2007 | Bonora |
| 7,294,581 | B2 | 11/2007 | Iyer et al. |
| 7,297,641 | B2 | 11/2007 | Todd et al. |
| 7,298,009 | B2 | 11/2007 | Yan et al. |
| D557,226 | S | 12/2007 | Uchino et al. |
| 7,307,178 | B2 | 12/2007 | Kiyomori et al. |
| 7,312,148 | B2 | 12/2007 | Ramaswamy et al. |
| 7,312,162 | B2 | 12/2007 | Ramaswamy et al. |
| 7,312,494 | B2 | 12/2007 | Ahn et al. |
| 7,323,401 | B2 | 1/2008 | Ramaswamy et al. |
| 7,326,657 | B2 | 2/2008 | Xia et al. |
| 7,327,948 | B1 | 2/2008 | Shrinivasan |
| 7,329,947 | B2 | 2/2008 | Adachi et al. |
| 7,335,611 | B2 | 2/2008 | Ramaswamy et al. |
| 7,354,847 | B2 | 4/2008 | Chan et al. |
| 7,357,138 | B2 | 4/2008 | Ji et al. |
| 7,393,418 | B2 | 7/2008 | Yokogawa |
| 7,393,736 | B2 | 7/2008 | Ahn et al. |
| 7,393,765 | B2 | 7/2008 | Hanawa et al. |
| 7,396,491 | B2 | 7/2008 | Marking et al. |
| 7,399,388 | B2 | 7/2008 | Moghadam et al. |
| 7,402,534 | B2 | 7/2008 | Mahajani |
| 7,405,166 | B2 | 7/2008 | Liang et al. |
| 7,405,454 | B2 | 7/2008 | Ahn et al. |
| 7,414,281 | B1 | 8/2008 | Fastow |
| 7,422,775 | B2 | 9/2008 | Ramaswamy et al. |
| 7,429,532 | B2 | 9/2008 | Ramaswamy et al. |
| 7,431,966 | B2 | 10/2008 | Derderian et al. |
| 7,437,060 | B2 | 10/2008 | Wang et al. |
| 7,442,275 | B2 | 10/2008 | Cowans |
| 7,476,291 | B2 | 1/2009 | Wang et al. |
| 7,479,198 | B2 | 1/2009 | Guffrey |
| D585,968 | S | 2/2009 | Elkins et al. |
| 7,489,389 | B2 | 2/2009 | Shibazaki |
| 7,498,242 | B2 | 3/2009 | Kumar et al. |
| 7,501,292 | B2 | 3/2009 | Matsushita et al. |
| 7,503,980 | B2 | 3/2009 | Kida et al. |
| 7,514,375 | B1 | 4/2009 | Shanker et al. |
| D593,969 | S | 6/2009 | Li |
| 7,541,297 | B2 | 6/2009 | Mallick et al. |
| 7,547,363 | B2 | 6/2009 | Tomiyasu et al. |
| 7,566,891 | B2 | 7/2009 | Rocha-Alvarez et al. |
| 7,575,968 | B2 | 8/2009 | Sadaka et al. |
| 7,579,785 | B2 | 8/2009 | Shinmen et al. |
| 7,582,555 | B1 | 9/2009 | Lang |
| 7,589,029 | B2 | 9/2009 | Derderian et al. |
| D602,575 | S | 10/2009 | Breda |
| 7,601,223 | B2 | 10/2009 | Lindfors et al. |
| 7,601,225 | B2 | 10/2009 | Tuominen et al. |
| 7,611,980 | B2 | 11/2009 | Wells et al. |
| 7,618,226 | B2 | 11/2009 | Takizawa |
| 7,629,277 | B2 | 12/2009 | Ghatnagar |
| 7,632,549 | B2 | 12/2009 | Goundar |
| 7,640,142 | B2 | 12/2009 | Tachikawa et al. |
| 7,651,583 | B2 | 1/2010 | Kent et al. |
| 7,651,961 | B2 | 1/2010 | Clark |
| D609,655 | S | 2/2010 | Sugimoto |
| 7,678,197 | B2 | 3/2010 | Maki |
| 7,682,657 | B2 | 3/2010 | Sherman |
| D613,829 | S | 4/2010 | Griffin et al. |
| D614,153 | S | 4/2010 | Fondurulia et al. |
| D614,267 | S | 4/2010 | Breda |
| D614,268 | S | 4/2010 | Breda |
| 7,690,881 | B2 | 4/2010 | Yamagishi |
| 7,691,205 | B2 | 4/2010 | Ikedo |
| 7,713,874 | B2 | 5/2010 | Milligan |
| 7,720,560 | B2 | 5/2010 | Menser et al. |
| 7,723,648 | B2 | 5/2010 | Tsukamoto et al. |
| 7,727,864 | B2 | 6/2010 | Elers |
| 7,732,343 | B2 | 6/2010 | Niroomand et al. |
| 7,740,705 | B2 | 6/2010 | Li |
| 7,767,262 | B2 | 8/2010 | Clark |
| 7,780,440 | B2 | 8/2010 | Shibagaki et al. |
| 7,789,965 | B2 | 9/2010 | Matsushita et al. |
| 7,790,633 | B1 | 9/2010 | Tarafdar et al. |
| 7,803,722 | B2 | 9/2010 | Liang |
| 7,807,578 | B2 | 10/2010 | Bencher et al. |
| 7,816,278 | B2 | 10/2010 | Reed et al. |
| 7,824,492 | B2 | 11/2010 | Tois et al. |
| 7,825,040 | B1 | 11/2010 | Fukazawa et al. |
| 7,833,353 | B2 | 11/2010 | Furukawahara et al. |
| 7,838,084 | B2 | 11/2010 | Derderian et al. |
| 7,842,518 | B2 | 11/2010 | Miyajima |
| 7,842,622 | B1 | 11/2010 | Lee et al. |
| D629,874 | S | 12/2010 | Hermans |
| 7,851,019 | B2 | 12/2010 | Tuominen et al. |
| 7,851,232 | B2 | 12/2010 | van Schravendijk et al. |
| 7,865,070 | B2 | 1/2011 | Nakamura |
| 7,884,918 | B2 | 2/2011 | Hattori |
| 7,888,233 | B1 | 2/2011 | Gauri |
| D634,719 | S | 3/2011 | Yasuda et al. |
| 7,897,215 | B1 | 3/2011 | Fair et al. |
| 7,902,582 | B2 | 3/2011 | Forbes et al. |
| 7,910,288 | B2 | 3/2011 | Abatchev et al. |
| 7,915,139 | B1 | 3/2011 | Lang |
| 7,919,416 | B2 | 4/2011 | Lee et al. |
| 7,925,378 | B2 | 4/2011 | Gilchrist et al. |
| 7,935,940 | B1 | 5/2011 | Smargiassi |
| 7,963,736 | B2 | 6/2011 | Takizawa et al. |
| 7,972,980 | B2 | 7/2011 | Lee et al. |
| 7,981,751 | B2 | 7/2011 | Zhu et al. |
| D643,055 | S | 8/2011 | Takahashi |
| 7,994,721 | B2 | 8/2011 | Espiau et al. |
| 8,003,174 | B2 | 8/2011 | Fukazawa |
| 8,004,198 | B2 | 8/2011 | Bakre et al. |
| 8,038,835 | B2 | 10/2011 | Hayashi et al. |
| 8,041,197 | B2 | 10/2011 | Kasai et al. |
| 8,041,450 | B2 | 10/2011 | Takizawa et al. |
| 8,055,378 | B2 | 11/2011 | Numakura |
| 8,060,252 | B2 | 11/2011 | Gage et al. |
| 8,071,451 | B2 | 12/2011 | Berry |
| 8,071,452 | B2 | 12/2011 | Raisanen |
| 8,072,578 | B2 | 12/2011 | Yasuda |
| 8,076,230 | B2 | 12/2011 | Wei |
| 8,082,946 | B2 | 12/2011 | Laverdiere et al. |
| D652,896 | S | 1/2012 | Gether |
| 8,092,604 | B2 | 1/2012 | Tomiyasu et al. |
| D653,734 | S | 2/2012 | Sisk |
| D655,055 | S | 2/2012 | Toll |
| 8,137,462 | B2 | 3/2012 | Fondurulia et al. |
| 8,137,465 | B1 | 3/2012 | Shrinivasan et al. |
| 8,138,676 | B2 | 3/2012 | Mills |
| 8,142,862 | B2 | 3/2012 | Lee et al. |
| 8,143,174 | B2 | 3/2012 | Xia et al. |
| 8,147,242 | B2 | 4/2012 | Shibagaki et al. |
| 8,173,554 | B2 | 5/2012 | Lee et al. |
| 8,187,951 | B1 | 5/2012 | Wang |
| 8,192,901 | B2 | 6/2012 | Kageyama |
| 8,196,234 | B2 | 6/2012 | Glunk |
| 8,197,915 | B2 | 6/2012 | Oka et al. |
| 8,216,380 | B2 | 7/2012 | White et al. |
| 8,231,799 | B2 | 7/2012 | Bera et al. |
| D665,055 | S | 8/2012 | Yanagisawa et al. |
| 8,241,991 | B2 | 8/2012 | Hsieh et al. |
| 8,242,031 | B2 | 8/2012 | Mallick et al. |
| 8,252,114 | B2 | 8/2012 | Vukovic |
| 8,252,659 | B2 | 8/2012 | Huyghebaert et al. |
| 8,252,691 | B2 | 8/2012 | Beynet et al. |
| 8,278,176 | B2 | 10/2012 | Bauer et al. |
| 8,282,769 | B2 | 10/2012 | Iizuka |
| 8,287,648 | B2 | 10/2012 | Reed et al. |
| 8,293,016 | B2 | 10/2012 | Bahng et al. |
| 8,298,951 | B1 | 10/2012 | Nakano |

(56) References Cited

U.S. PATENT DOCUMENTS

| | | | |
|---|---|---|---|
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| 8,367,528 B2 | 2/2013 | Bauer et al. |
| 8,372,204 B2 | 2/2013 | Nakamura |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 12/2013 | Goto et al. |
| 8,647,722 B2 | 2/2014 | Kobayashi et al. |
| 8,664,627 B1 | 3/2014 | Ishikawa et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,743 B1 | 7/2014 | Omori et al. |
| 8,802,201 B2 | 8/2014 | Raisanen et al. |
| 8,820,809 B2 | 9/2014 | Ando et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,940,646 B1 | 1/2015 | Chandrasekharan |
| 8,945,306 B2 * | 2/2015 | Tsuda .................. C23C 16/409 |
| | | | 118/715 |
| D724,701 S | 3/2015 | Yamagishi et al. |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano |
| D732,644 S | 6/2015 | Yamagishi et al. |
| D733,261 S | 6/2015 | Yamagishi et al. |
| D733,843 S | 7/2015 | Yamagishi et al. |
| 9,117,657 B2 | 8/2015 | Nakano et al. |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,171,716 B2 | 10/2015 | Fukuda |
| 9,190,263 B2 | 11/2015 | Ishikawa et al. |
| 9,202,727 B2 | 12/2015 | Dunn et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0116087 A1 * | 6/2003 | Nguyen .................. C23C 16/34 |
| | | | 118/715 |
| 2003/0134038 A1 | 7/2003 | Paranjpe |
| 2003/0141820 A1 * | 7/2003 | White et al. ............. 315/111.21 |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0198587 A1 | 10/2003 | Kaloyeros |
| 2003/0209323 A1 | 11/2003 | Yokogaki |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124549 A1 | 7/2004 | Curran |
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0168627 A1 | 9/2004 | Conley et al. |

(56) References Cited

U.S. PATENT DOCUMENTS

| | | |
|---|---|---|
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1* | 5/2005 | Kilpela et al. ............... 118/715 |
| 2005/0095770 A1 | 5/2005 | Kumagai et al. |
| 2005/0100669 A1* | 5/2005 | Kools et al. ............. 427/255.23 |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1* | 11/2005 | Shero et al. ..................... 34/443 |
| 2005/0241763 A1 | 11/2005 | Huang et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1* | 11/2006 | Verghese et al. ............... 118/715 |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054405 A1 | 3/2007 | Jacobs et al. |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0077355 A1 | 4/2007 | Chacin et al. |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |

(56) References Cited

U.S. PATENT DOCUMENTS

| | | |
|---|---|---|
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVancentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVancentis et al. |
| 2007/0264807 A1 | 11/2007 | Leone et al. |
| 2007/0275166 A1 | 11/2007 | Thridandam et al. |
| 2007/0277735 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1* | 1/2008 | Ueno et al. .............. 118/730 |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Fukazawa et al. |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0133154 A1 | 6/2008 | Krauss et al. |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukuzawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |

(56) References Cited

U.S. PATENT DOCUMENTS

| | | |
|---|---|---|
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0143032 A1 | 6/2011 | Vrtis et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0239936 A1 | 10/2011 | Suzuki et al. |
| 2011/0254052 A1 | 10/2011 | Kouvetakis |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |
| 2012/0024479 A1 | 2/2012 | Palagashvili et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabari et al. |
| 2013/0019945 A1 | 1/2013 | Hekmatshoar-Tabari et al. |
| 2013/0023129 A1 | 1/2013 | Reed |
| 2013/0048606 A1 | 2/2013 | Mao et al. |
| 2013/0068970 A1 | 3/2013 | Matsushita |
| 2013/0078392 A1 | 3/2013 | Xiao et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0036274 A1 | 2/2014 | Marquardt et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |

(56) References Cited

U.S. PATENT DOCUMENTS

| | | | |
|---|---|---|---|
| 2014/0084341 A1 | 3/2014 | Weeks | |
| 2014/0087544 A1 | 3/2014 | Tolle | |
| 2014/0096716 A1 | 4/2014 | Chung et al. | |
| 2014/0099798 A1 | 4/2014 | Tsuji | |
| 2014/0103145 A1 | 4/2014 | White et al. | |
| 2014/0116335 A1 | 5/2014 | Tsuji et al. | |
| 2014/0120487 A1 | 5/2014 | Kaneko | |
| 2014/0127907 A1 | 5/2014 | Yang | |
| 2014/0159170 A1 | 6/2014 | Raisanen et al. | |
| 2014/0174354 A1 | 6/2014 | Arai | |
| 2014/0175054 A1 | 6/2014 | Carlson et al. | |
| 2014/0182053 A1 | 7/2014 | Huang | |
| 2014/0217065 A1 | 8/2014 | Winkler et al. | |
| 2014/0220247 A1 | 8/2014 | Haukka et al. | |
| 2014/0225065 A1 | 8/2014 | Rachmady et al. | |
| 2014/0227072 A1 | 8/2014 | Lee et al. | |
| 2014/0251953 A1 | 9/2014 | Winkler et al. | |
| 2014/0251954 A1 | 9/2014 | Winkler et al. | |
| 2014/0283747 A1 | 9/2014 | Kasai et al. | |
| 2014/0346650 A1 | 11/2014 | Raisanen et al. | |
| 2014/0349033 A1 | 11/2014 | Nonaka et al. | |
| 2014/0363980 A1 | 12/2014 | Kawamata et al. | |
| 2014/0367043 A1 | 12/2014 | Bishara et al. | |
| 2015/0004316 A1 | 1/2015 | Thompson et al. | |
| 2015/0004317 A1 | 1/2015 | Dussarrat et al. | |
| 2015/0007770 A1 | 1/2015 | Chandrasekharan et al. | |
| 2015/0014632 A1 | 1/2015 | Kim et al. | |
| 2015/0024609 A1 | 1/2015 | Milligan et al. | |
| 2015/0048485 A1 | 2/2015 | Tolle | |
| 2015/0078874 A1 | 3/2015 | Sansoni | |
| 2015/0086316 A1 | 3/2015 | Greenberg | |
| 2015/0091057 A1 | 4/2015 | Xie et al. | |
| 2015/0096973 A1 | 4/2015 | Dunn et al. | |
| 2015/0099072 A1 | 4/2015 | Takamure et al. | |
| 2015/0132212 A1 | 5/2015 | Winkler et al. | |
| 2015/0140210 A1 | 5/2015 | Jung et al. | |
| 2015/0147483 A1 | 5/2015 | Fukazawa | |
| 2015/0147877 A1 | 5/2015 | Jung | |
| 2015/0167159 A1 | 6/2015 | Halpin et al. | |
| 2015/0170954 A1 | 6/2015 | Agarwal | |
| 2015/0174768 A1 | 6/2015 | Rodnick | |
| 2015/0184291 A1 | 7/2015 | Alokozai et al. | |
| 2015/0187568 A1 | 7/2015 | Pettinger et al. | |
| 2015/0217456 A1 | 8/2015 | Tsuji et al. | |
| 2015/0240359 A1 | 8/2015 | Jdira et al. | |
| 2015/0267295 A1 | 9/2015 | Hill et al. | |
| 2015/0267297 A1 | 9/2015 | Shiba | |
| 2015/0267299 A1 | 9/2015 | Hawkins | |
| 2015/0267301 A1 | 9/2015 | Hill et al. | |
| 2015/0284848 A1 | 10/2015 | Nakano et al. | |
| 2015/0287626 A1 | 10/2015 | Arai | |
| 2015/0308586 A1 | 10/2015 | Shugrue et al. | |
| 2015/0315704 A1 | 11/2015 | Nakano et al. | |
| 2016/0035566 A1* | 2/2016 | Lavoie | H01L 21/02337 438/778 |

FOREIGN PATENT DOCUMENTS

| | | |
|---|---|---|
| CN | 101522943 | 9/2009 |
| CN | 101423937 A | 9/2011 |
| EP | 2036600 | 3/2009 |
| EP | 2426233 | 7/2012 |
| JP | 03-044472 | 2/1991 |
| JP | 04115531 | 4/1992 |
| JP | 07-034936 | 8/1995 |
| JP | 7-272694 | 10/1995 |
| JP | 07283149 A * | 10/1995 |
| JP | 08-181135 | 7/1996 |
| JP | 08335558 | 12/1996 |
| JP | 08335558 A * | 12/1996 |
| JP | 10-064696 | 6/1998 |
| JP | 10-0261620 | 9/1998 |
| JP | 2845163 | 1/1999 |
| JP | 2001342570 | 12/2001 |
| JP | 2004014952 A | 1/2004 |
| JP | 2004091848 | 3/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 2006186271 A * | 7/2006 |
| JP | 3140111 | 3/2008 |
| JP | 2008060304 | 3/2008 |
| JP | 2008527448 | 7/2008 |
| JP | 2008202107 | 9/2008 |
| JP | 2009016815 | 1/2009 |
| JP | 2009099938 | 5/2009 |
| JP | 2010097834 | 4/2010 |
| JP | 2010205967 | 9/2010 |
| JP | 2010251444 | 10/2010 |
| JP | 2012089837 | 5/2012 |
| TW | I226380 | 1/2005 |
| TW | 200701301 A | 1/2007 |
| WO | 9832893 | 7/1998 |
| WO | 2004010467 | 1/2004 |
| WO | 2006054854 | 5/2006 |
| WO | 2006/056091 A1 | 6/2006 |
| WO | 2006/078666 | 7/2006 |
| WO | 2006080782 | 8/2006 |
| WO | 2006101857 | 9/2006 |
| WO | 2007140376 | 12/2007 |
| WO | 2010039363 | 4/2010 |

OTHER PUBLICATIONS

USPTO; Office Action dated Feb. 15, 2011 in U.S. Appl. No. 12/118,596.

PCT; International Search report and Written Opinion dated Jan. 12, 2011 in Application No. PCT/US2010/045368.

Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.

Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.

USPTO; Office Action dated Aug. 27, 2010 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

USPTO; Office Action dated Apr. 23, 2013 in U.S. Appl. No. 12/763,037.

PCT; International Search report and Written Opinion dated Feb. 6, 2013 in Application No. PCT/US2012/065343.

PCT; International Search report and Written Opinion dated Feb. 13, 2013 in Application No. PCT/US2012/065347.

Chinese Patent Office; Office Action dated Jan. 10, 2013 is Serial No. 201080015699.9.

Novaro et al. Theoretical Study on a Reaction Pathway of Ziegler-Natta-Type Catalysis, J. Chem. Phys. 68(5), Mar. 1, 1978 p. 2337-2351.

USPTO; Final Office Action dated Jun. 28, 2013 in U.S. Appl. No. 12/754,223.

USPTO; Office Action dated Feb. 25, 2014 in U.S. Appl. No. 12/754,223.

USPTO; Restriction Requirement dated Sep. 25, 2012 in U.S. Appl. No. 12/854,818.

USPTO; Office Action dated Dec. 6, 2012 in U.S. Appl. No. 12/854,818.

USPTO; Final Office Action dated Mar. 13, 2013 in U.S. Appl. No. 12/854,818.

(56) References Cited

OTHER PUBLICATIONS

USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 110, pp. 043535-1-043535-6, (2011).
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.

(56) References Cited

OTHER PUBLICATIONS

Taiwan Patent Office; Office Action dated Jul. 4, 2014 in Application No. 099110511.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated 01/247/2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Final Office Action dated Aug. 12, 2015 in U.S. Appl. No. 12/754,223.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.

(56) References Cited

OTHER PUBLICATIONS

USPTO; Notice of Allowance dated Sep. 13, 2012 in U.S. Appl. No. 13/085,968.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Jun. 17, 2015 in U.S. Appl. No. 13/283,408.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Notice of Allowance dated Oct. 6, 2015 in U.S. Appl. No. 13/411,271.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Notice of Allowance dated Aug. 28, 2015 in U.S. Appl. No. 13/597,043.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Nov. 19, 2015 in U.S. Appl. No. 13/651,144.
USPTO; Non-Final Office Action dated Jun. 18, 2015 in U.S. Appl. No. 13/665,366.
USPTO; Notice of Allowance dated Aug. 24, 2015 in U.S. Appl. No. 13/677,133.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.

(56) References Cited

OTHER PUBLICATIONS

USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Oct. 26, 2015 in U.S. Appl. No. 13/791,246.
USPTO; Non-Final Office Action dated Nov. 6, 2015 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; USPTO; Final Office Action dated Sep. 14, 2015 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Notice of Allowance dated Sep. 11, 2015 in U.S. Appl. No. 14/040,196.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Sep. 1, 2015 in U.S. Appl. No. 14/079,302.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Final Office Action dated Jul. 10, 2015 in U.S. Appl. No. 14/183,187.
USPTO; Non-Final Office Action dated Oct. 8, 2015 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Non-Final Office Action dated Sep. 18, 2015 in U.S. Appl. No. 14/244,689.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Oct. 20, 2015 in U.S. Appl. No. 14/281,477.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Final Office Action dated Jul. 16, 2015 in U.S. Appl. No. 14/563,044.
USPTO; Non-Final Office Action dated Oct. 1, 2015 in U.S. Appl. No. 14/571,126.
USPTO; Non-Final Office Action dated Nov. 19, 2015 in U.S. Appl. No. 14/659,437.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatement," Journal of the Korean Physical Society, 37, 6, 878-881 (2000).

(56) References Cited

OTHER PUBLICATIONS

Choi et al., "Low Temperature Formation of Silicon Oxide Thin Films by Atomic Layer Deposition Using NH3/O2 Plasma," ECS Solid State Letters, 2(12) P114-P116 (2013).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma. Aid and Pecvd, 35th IEEE PVCS, Jun. 2010.
Drummond et al., "Hydrophobic Radiofrequency Plasma-Deposited Polymer Films. Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Heo et al., "Structural Characterization of Nanoporous Low-Dielectric Constant SiCOH Films Using Organosilane Precursors," NSTI-Nanotech, vol. 4, 122-123 (2007).
Jung et al., "Double Patterning of Contact Array with Carbon Polymer," Proc. Of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706(2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions. College of Information and Communication Engineerign. Sungkyunkwan University, 53(1).
King, Plasma Enhanced Atomic Layer Deposition of SiNx: H and SiO2, J. Vac. Sci. Technol., A29(4) (2011).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society. 48, 1. 131-136 (2006).
Kurosawa et al., "Synthesis and Characterization of Plasma-Polymerized Hexamethyldisiloxane Films," Thin Solid Films, 506-507, 176-179 (2006).
Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector for Wafer Transfer Robot," Industrial Robot: An International Journal, 79-91 (2012).
Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Marsik et al., "Effect of Ultraviolet Curing Wavelength on Low-k Dielectric Material Proerties and Plasma Damage Resistance," Sciencedirect.com, 519, 11, 3619-3626 (2011).
Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).
Mukai et al., "A Study of CD Budget in Spacer Patterning Technology," Proc. Of SPIE, 6924, 1-8 (2008).
Nogueira et al., "Production of Highly Hydrophobic Films Using Low Frequency and High Density Plasma," Revista Brasileira de Aplicacoes de Vacuo, 25(1), 45-53 (2006).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
Shamma et al., "PDL Oxide Enabled Doubling," Proc. Of SPIE, 6924, 69240D, 1-10 (2008).
Wirths, et al, "SiGeSn Growth tudies Using Reduced Pressure Chemical Vapor Deposition Towards Optoeleconic Applications," This Soid Films, 557, 183-187 (2014).
Yun et al., "Behavior of Various Organosilicon Molecules in PECVD Processes for Hydrocarbon-Doped Silicon Oxide Films," Solid State Phenomena, vol. 124-126, 347-350 (2007).

\* cited by examiner

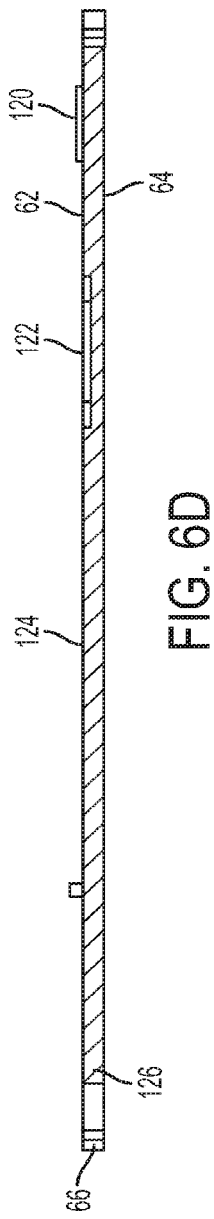
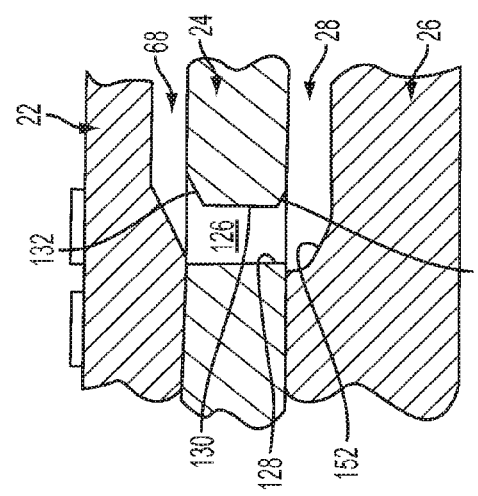

SEMICONDUCTOR PROCESSING REACTOR AND COMPONENTS THEREOF

CROSS-REFERENCE TO RELATED APPLICATIONS

The present application claims priority under 35 U.S.C. 119(e) to U.S. Provisional Patent Application No. 61/167,093, filed Apr. 6, 2009.

FIELD OF THE INVENTION

The present application relates generally to semiconductor processing equipment and specifically to an apparatus and system for delivering process gases to a substrate reaction chamber.

BACKGROUND OF THE INVENTION

Atomic layer deposition ("ALD") is a well known process in the semiconductor industry for forming thin films of materials on substrates such as silicon wafers. ALD is a type of vapor deposition wherein a film is built up through deposition of multiple ultra-thin layers with the thickness of the film being determined by the number of layers deposited. In an ALD process, gaseous molecules of one or more compounds (precursors) of the material to be deposited are supplied to the substrate or wafer to form a thin film of that material on the substrate. In one pulse, a first precursor material is adsorbed largely intact in a self-limiting process on the substrate. The precursor material may be decomposed in a subsequent reactant pulse to form a single molecular layer of the desired material. Alternatively, the adsorbed precursor material may react with the reactant of a subsequent reactant pulse to form a single molecular layer of a compound. Thicker films are produced through repeated growth cycles until the target thickness is achieved.

In an ALD process, one or more substrates with at least one surface to be coated are introduced into the reactor or deposition chamber. The substrate is heated to a desired temperature above the condensation temperature but below the thermal decomposition temperature of the selected vapor phase reactants. One reactant is capable of reacting with the adsorbed species of a prior reactant to form a desired product on the substrate surface. The product can be in the form of a film, liner, or layer.

During an ALD process, the reactant pulses, all of which are typically in vapor or gaseous form, are pulsed sequentially into the reactor with removal steps between reactant pulses. For example, inert gas pulses are provided between the pulses of reactants. The inert gas purges the chamber of one reactant pulse before the next reactant pulse to avoid gas phase mixing or CVD type reactions. A characteristic feature of ALD is that each reactant is delivered to the substrate until a saturated surface condition is reached. The cycles are repeated to form an atomic layer of the desired thickness. To obtain a self-limiting growth, sufficient amount of each precursor is provided to saturate the substrate. As the growth rate is self-limiting, the rate of growth is proportional to the repetition rate of the reaction sequences rather than to the flux of reactant as in CVD.

Typical reaction chambers used for ALD processing include a top plate and a bottom plate with a slot formed through the top plate. The slot allows process gases to be introduced into the reaction chamber therethrough, and the slot is a substantially linear opening arranged perpendicular to the primary access of gas flow. However, because the process gases introduced into the reaction chamber through the slot typically have the same flow velocity along the entire width of the slot, as the process gases flow through the reaction chamber, the amount of time that it takes for the process gases to contact a leading edge of the wafer differs across the width of the reaction chamber. In other words, although the velocity of process gases being introduced into the reaction chamber via the slot is substantially constant across the width of the slot, the time that it takes for the gases introduced into the reaction chamber near the edges of the reaction chamber to contact the leading edge of the substrate is greater than the time it takes for the gases introduced into the reaction chamber near the centerline of the reaction chamber to contact the leading edge of the substrate, as illustrated in FIG. 1A. Hence, the leading edge of the substrate near the centerline of the reaction chamber is exposed to a greater amount of process gases before the lateral-most edges of the substrate closest to the side walls of the reaction chamber are exposed to process gases. This typically results in the leading edge of the substrate near the centerline of the reaction chamber having a greater deposition thickness than the lateral edges of the substrate over many ALD cycles because the concentration of precursor in the process gas decreases as the precursor adsorbs to the leading edge of the substrate nearer the centerline of the reaction chamber. The decrease in precursor concentration within the process gases flowing over the substrate from the leading to the trailing edge of the substrate—and a similar decrease in concentration from the longitudinal centerline relative to the side edges of the reaction chamber—results in non-uniform deposition on the substrate. Accordingly, the ideal residence time distribution of process gases introduced into the reaction chamber through a slot should be substantially the same across the entire width of the slot such that the time that it takes the process gases to travel from the slot to a corresponding location of the leading edge of the substrate is constant across the width of the reaction chamber.

The residence time distribution ("RTD") is a contour of constant time (i.e., the time it takes for a fluid element to reach a fixed location is constant) should be optimized such that the shape of the RTD corresponds to the entire leading edge of the substrate, as shown in FIG. 1B. Thus, there is a wave of process gases having substantially the same concentration across the entire leading edge of the substrate, from the lateral edges to the front edge of the substrate near the centerline of the reaction chamber.

Therefore, a need exists for a gas delivery system that distributes process gases such that the distributed process gases are introduced into a reaction chamber resulting in a pre-determined RTD between the slot introducing the process gases into the reaction chamber and the leading edge of the substrate to produce a more uniform film deposition across the entire substrate being processed.

BRIEF SUMMARY OF THE INVENTION

In one aspect of the present invention, a gas delivery system for delivering at least one process gas to a reaction chamber is provided. The gas delivery system includes a diffuser that is in fluid communication with the reaction chamber. The diffuser is attached directly to an upper surface of the reaction chamber. A diffuser volume for distributing the process gas is defined between the diffuser and the upper surface of the reaction chamber.

In another aspect of the present invention, a diffuser for distributing at least one process gas prior to introduction of the process gas into a reaction chamber is provided. The diffuser includes an inlet portion having a channel formed therethrough for receiving the process gas. The diffuser further includes a distribution portion attached to the inlet portion. The distribution portion comprises a mounting surface, a first distribution surface, a second distribution surface, a third distribution surface, and a fourth distribution surface, wherein the first, second, third, and fourth distribution surfaces extend laterally between a first side surface and a second side surface. The first and second side surfaces extend between the first, second, third, and fourth distribution surfaces and the mounting surface.

In yet another aspect of the present invention, a reactor for processing a semiconductor substrate is provided. The reactor includes a diffuser. The diffuser has at least a first wetted surface. The reactor further includes a reaction chamber operatively connected to the diffuser. The reaction chamber is in fluid communication with the diffuser, and the reaction chamber has at least a second wetted surface. The reactor also includes a surface texturing on at least one of the first, second, or third wetted surfaces. The surface texturing has a surface roughness of between about 50-250 Ra.

Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF SEVERAL VIEWS OF THE DRAWINGS

FIG. 6D is a cross-sectional view of the top plate shown in FIG. 6B taken along the line F-F.

FIG. 6E is a magnified cross-sectional view of a portion of the gas distribution system and reaction chamber shown in FIG. 4.

DETAILED DESCRIPTION OF THE PREFERRED EMBODIMENT

Figure 2:
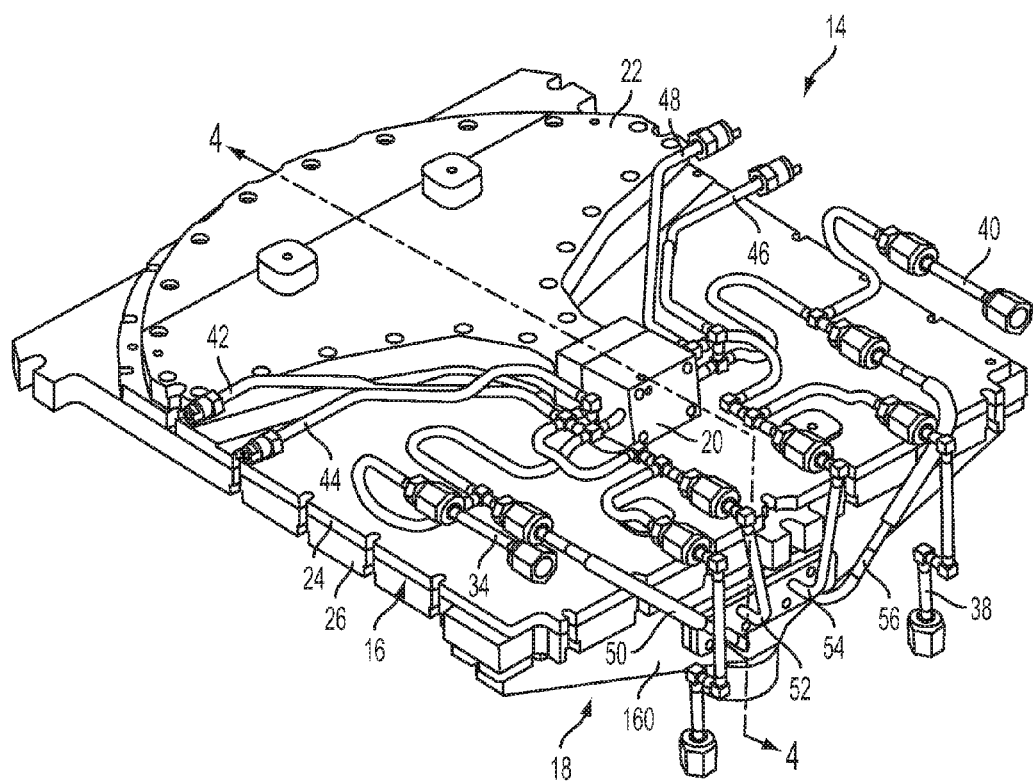
FIG. 2 is a top perspective view of an embodiment of a gas distribution system, reaction chamber, and an exhaust system.
Figure 3:
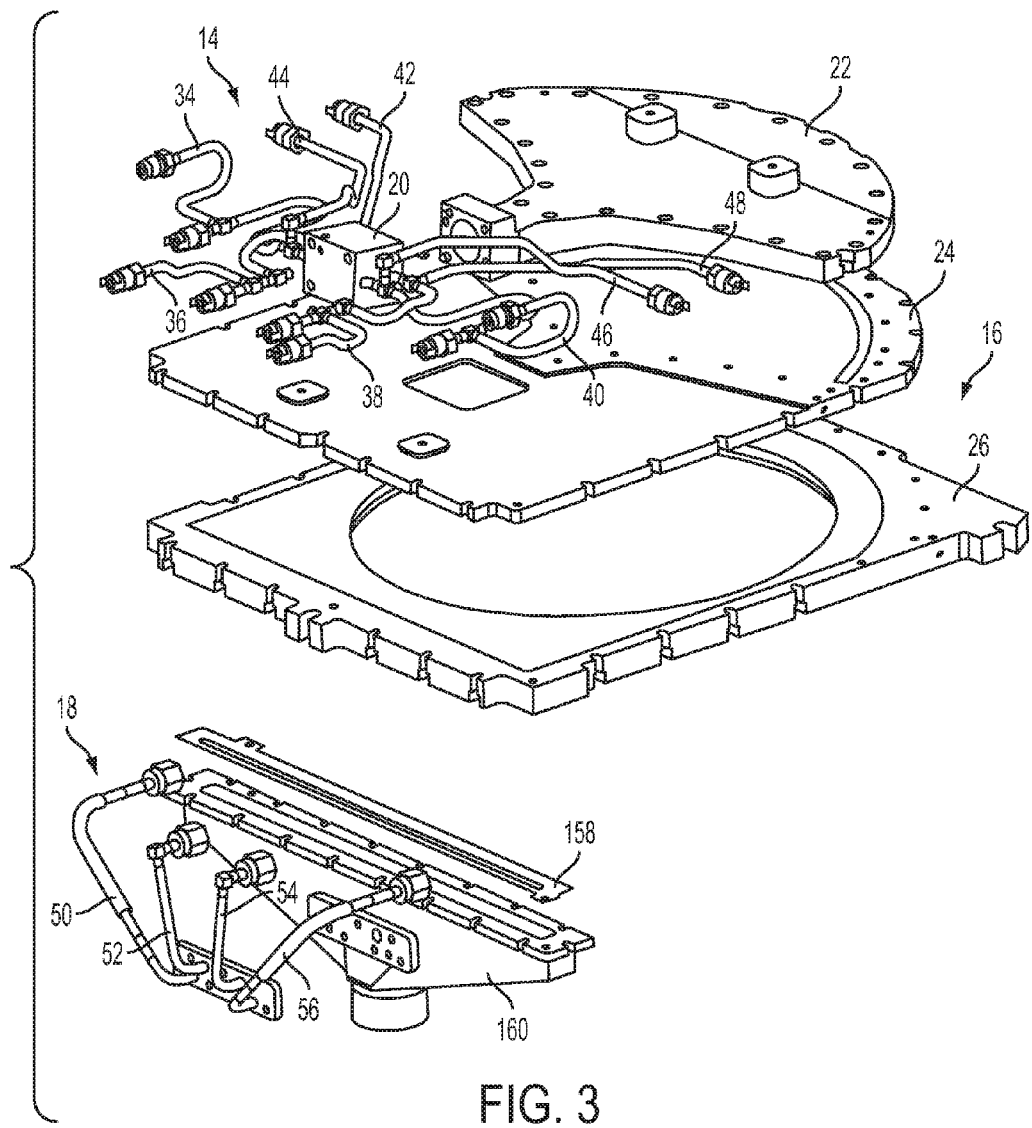
FIG. 3 is an exploded view of the gas distribution system, reaction chamber, and exhaust system shown in FIG. 2.
Figure 4:
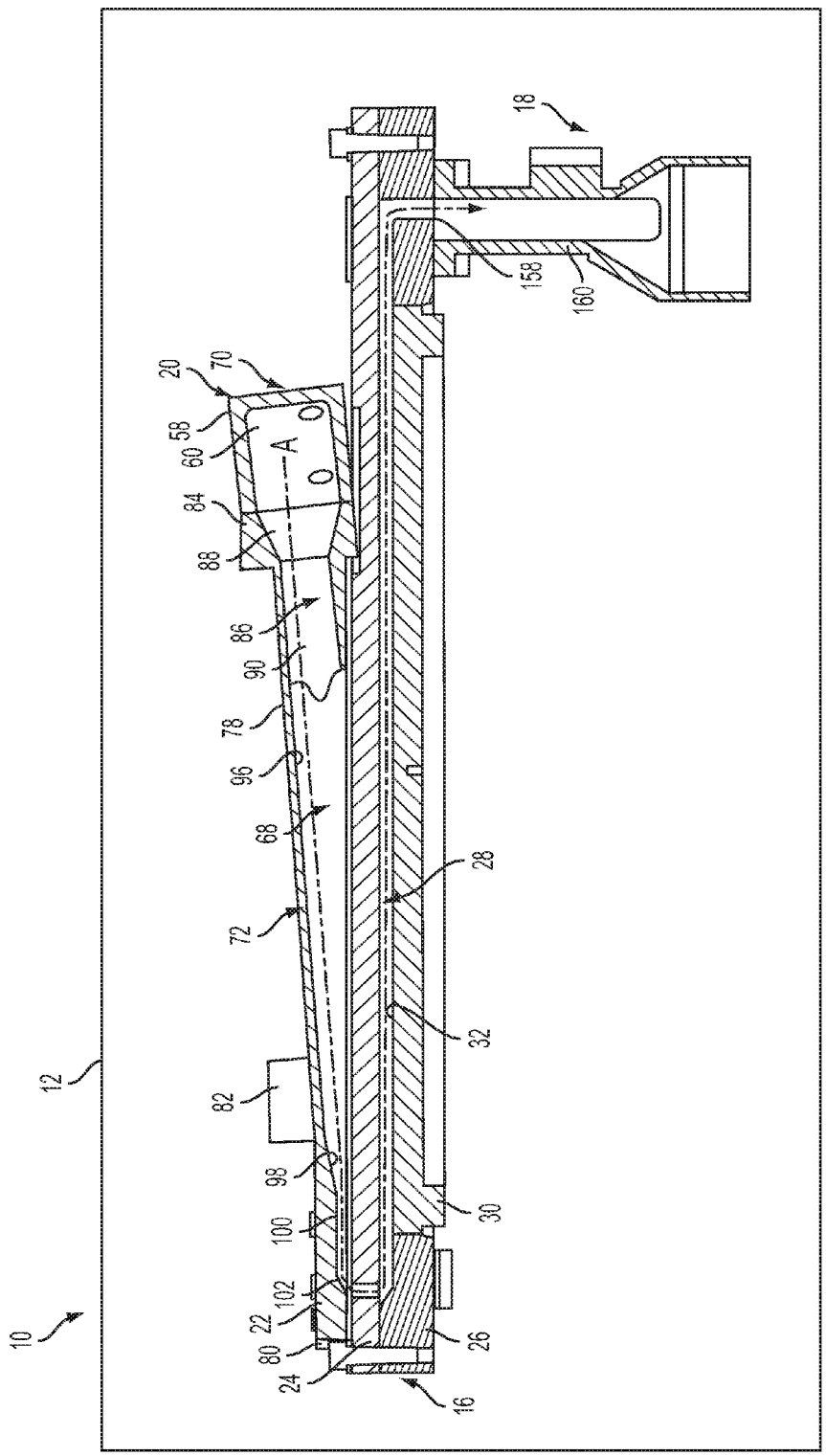
FIG. 4 is a cross-sectional view of the gas distribution system, reaction chamber, and exhaust system shown in FIG. 2 taken along line 4-4.

Referring to FIGS. 2-4, an exemplary embodiment of a reactor 10 for use in a semiconductor processing tool is shown. The reactor 10 includes a housing 12, a gas delivery system 14, a reaction chamber 16, and an exhaust assembly 18. The housing 12 forms a chamber in which a semiconductor substrate can be processed. The reactor 10 is configured to receive a semiconductor substrate that is inserted into the reaction chamber 16. Once in the reaction chamber 16, any number of different processes and chemical reactions can be performed on the substrate including an etching process, a film deposition process, a baking process, or any other process known to one of ordinary skill in the art. After the substrate is processed within the reaction chamber 16, the substrate is removed, and another substrate can then be inserted into the reaction chamber 16 to be processed. In an embodiment, the housing 12 provides a reduced pressure chamber in which the processing components reside. In another embodiment, the housing 12 provides a chamber that remains at or near atmospheric pressure.

Referring to FIGS. 2-4, an exemplary embodiment of the gas delivery system 14, reaction chamber 16, and exhaust assembly 18 are shown. The gas delivery system 14 includes a plurality of gas lines configured to transport gases to a mixer 20 that is in fluid communication with a diffuser 22. The diffuser 22 is operatively and fluidly connected to the reaction chamber 16 in which semiconductor substrates are processed. The reaction chamber 16 includes a top plate 24 and a bottom plate 26, and the top and bottom plates 24, 26 define a reaction space 28 therewithin. A susceptor 30 is configured to be raised and lowered relative to the reaction chamber 16 to introduce a substrate 32 into the reaction space 28 as well as remove the substrate 32 therefrom. The exhaust assembly 18 is operatively and fluidly connected to the reaction chamber 16 to withdraw process gases and effluent therefrom. As shown in FIG. 4, the flow path A of gases through the mixer 20, diffuser 22, reaction chamber 16, and exhaust assembly 18 is shown. In particular, the gases flowing through the mixer 20 and the diffuser 22 flow in the substantially opposite direction the direction of these gases flowing through the reaction chamber 16.

As shown in FIGS. 2-3, the gas delivery system 14 includes plurality of gas lines that are operatively connected to the mixer 20. In an embodiment, the gas lines for introducing reactant gases or liquids into the mixer 20 may include: a first reactant gas line 34, a second reactant gas line 36, a third reactant gas line 38, and a fourth reactant gas line 40. It should be understood by one of ordinary skill in the art that any number of reactant gas lines may be operatively and fluidly connected to the mixer 20 for delivering reactants thereto. The reactant gas lines 34, 36, 38, 40 are configured to transport reactants, such as a vaporized precursor from a solid source, a vaporized precursor from a liquid source, ozone, water or any other reactant that is used in processing a substrate. Although the gas lines 34, 36, 38, 40 are described as being configured to transport gases, it should be understood by one of ordinary skill in the art that gases, vapors, and/or liquids may likewise be transported through these lines to the mixer 20. The gas delivery system 14 also includes a first bypass line 42, a second bypass line 44, a third bypass line 46, and a fourth bypass line 46. The bypass lines 42, 44, 46, 48 are configured to transport an inert gas to the mixer 20. Each bypass line 42, 44, 46, 48 is operatively connected to a corresponding reactant gas line 34, 36, 38, 40. The bypass lines 42, 44, 46, 48 are in fluid communication with the corresponding reactant gas lines 34, 36, 38, 40 as well as the mixer 20. The gas delivery system 14 further includes a first back-suction line 50, a second back-suction line 52, a third back-suction line 54, and a fourth back-suction line 56. The back-suction lines 50, 52, 54, 56 are operatively and fluidly connected to a corresponding reactant gas line 34, 36, 38, 40, bypass line 42, 44, 46, 48, and the exhaust assembly 18. The back-suction lines 50, 52, 54, 56 are configured to selectively transfer reactant gases from the reactant gas lines 34, 36, 38, 40 and/or inert gases from the bypass lines 42, 44 to the exhaust assembly 18 by withdrawing these gases and bypassing the reaction chamber 16. In an embodiment, the reactant gas lines 34, 36, 38, 40, bypass lines 42, 44, 46, 48, and back-suction lines 50, 52, 54, 56 are all formed of titanium, but it should be understood by one of ordinary skill in the art that these lines can be made of stainless steel, or any other material that will not react with any gases or fluids being transferred to the mixer 20 or the exhaust assembly 18.

As shown in FIGS. 2-4, the gas delivery system 14 further includes a mixer 20 configured to receive the reactant gases and the inert gases from the reactant gas lines 34, 36, 38, 40 and bypass lines 42, 44, 46, 48. In an embodiment, the reactant gas lines 34, 36, 38, 40 are permanently attached to the mixer 20 via a weld. In another embodiment, the reactant gas lines 34, 36, 38, 40 are removably secured to the mixer 20 such that if a gas line is damaged or otherwise needs to be replaced, only the individual gas line and corresponding bypass and back-suction lines can be detached from the mixer 20 for replacement. In an embodiment, the mixer 20 includes a body 58 and a chamber 60 formed into the body 58, as shown in cross-section in FIG. 4. In an embodiment, two of the reactant gas lines 34, 36 are attached to one side of the body 58 and two other reactant gas lines 38, 40 are attached to the opposing side of the body such that gases can be introduced into the chamber 60 in opposing directions, thereby causing the gases to circulate within the chamber 60 prior to the gases flowing into the diffuser 22. The mixer 20 is removably attached to and in fluid communication with the diffuser 22. In an embodiment, the mixer 20 is formed of titanium, but it should be understood by one of ordinary skill in the art the mixer can alternatively be made of stainless steel, or any other material that will not react with any gases or fluids being transferred through the mixer 20 to the diffuser 22.

The gas delivery system 14 also includes a diffuser 22 in fluid communication with the mixer 20, and the diffuser 22 is configured to provide a distributed gas flow to the reaction chamber 16, as shown in FIG. 4. The top plate 24 of the reaction chamber 16 includes an upper surface 62, a lower surface 64, and an edge 66 that extends between the upper and lower surfaces 62, 64. The diffuser 22 is directly attached to the upper surface 62 of the reaction chamber 16, thereby defining a diffuser volume 68 therebetween. Referring to FIGS. 5A-5F, an exemplary embodiment of a diffuser 22 is shown. In the illustrated embodiment, the diffuser 22 is a fan-shaped member that is releasably securable to the upper surface 62 of the top plate 24 of the reaction chamber 16. The diffuser 22 includes an inlet portion 70 and a distribution portion 72. In an embodiment, the inlet portion 70 and the distribution portion 72 are integrally formed. In another embodiment, the inlet portion 70 and the distribution portion 72 are formed separately and subsequently fixedly attached to each other. The diffuser 22 further includes a connecting surface 74, a mounting surface 76, an upper surface 78, an end surface 80, and a pair of bosses 82 extending from the upper surface 78. The connecting surface 74 is configured to abut the body 58 of the mixer 20 when the diffuser 22 is attached thereto. The mounting surface 76 is configured to contact the upper surface 62 of the top plate 24 of the reaction chamber 16 to which the diffuser 22 is attached. The upper surface 78 of the diffuser 22 is the surface opposing the mounting surface 76 and is directed away from the reaction chamber 16. The end surface 80 extends between the mounting surface 76 and the upper surface 78, and the end surface 80 is a curved surface that forms the curved end of the diffuser 22 opposite the inlet portion 70.

Figure 5A:
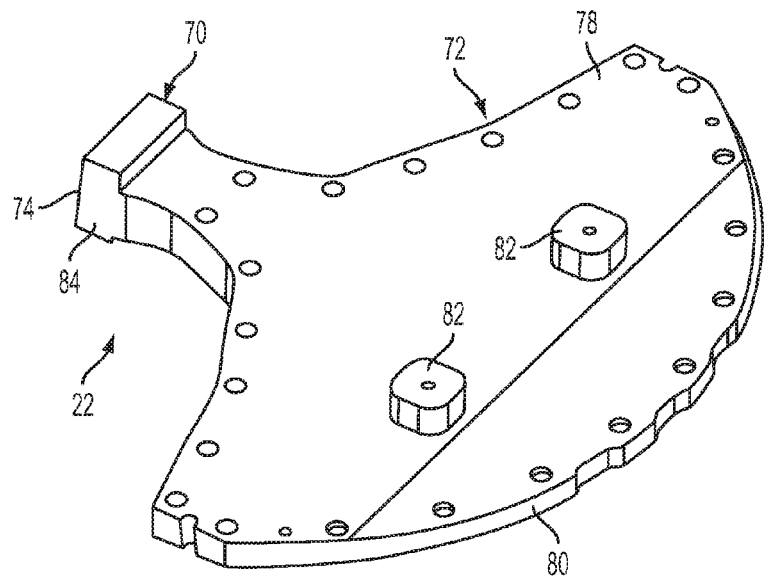
FIG. 5A is a top perspective view of an embodiment of a diffuser.
Figure 5B:
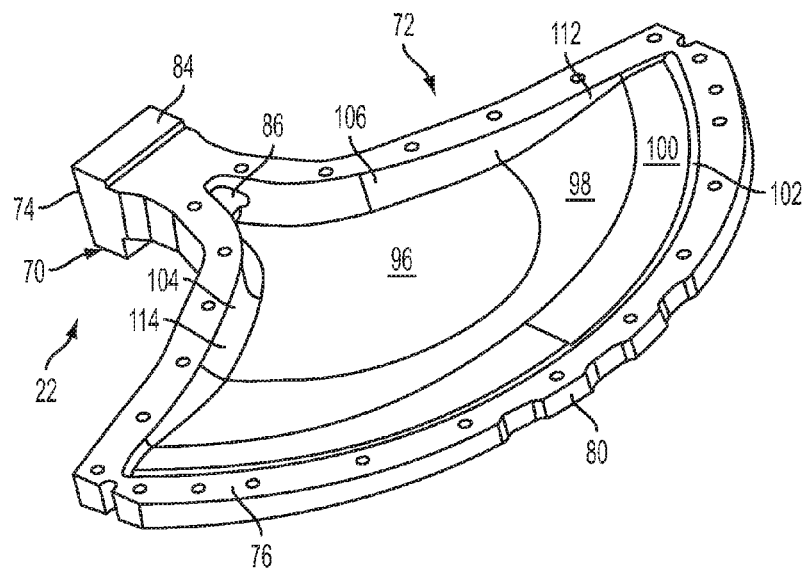
FIG. 5B is a bottom perspective view of the diffuser shown in FIG. 5A.
Figure 5C:
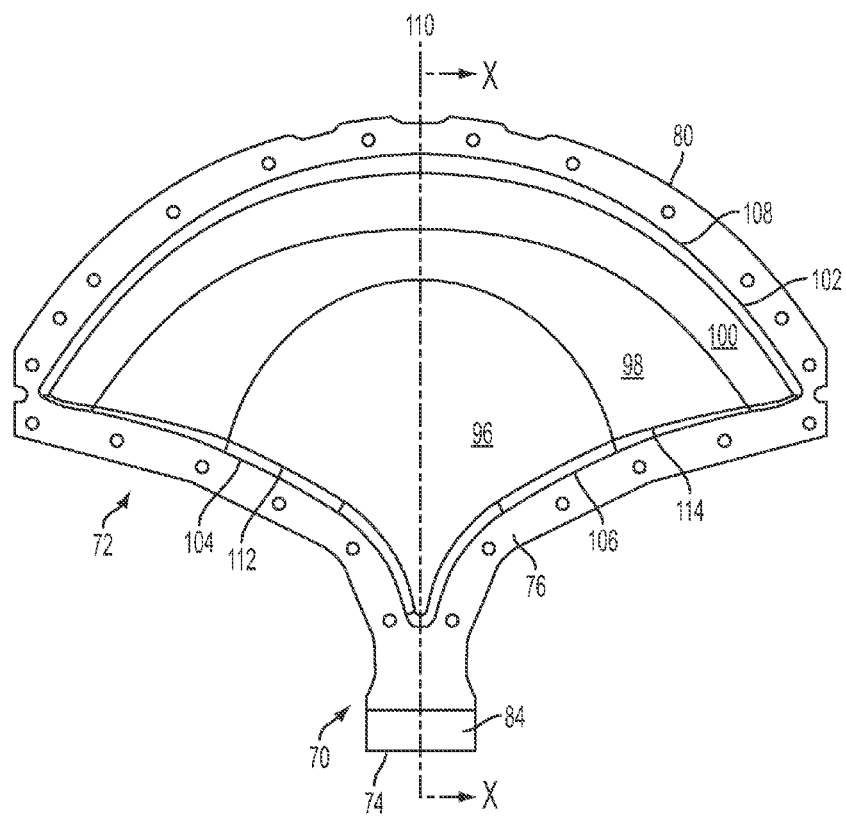
FIG. 5C is a bottom plan view of the diffuser shown in FIG. 5A.
Figure 5D:
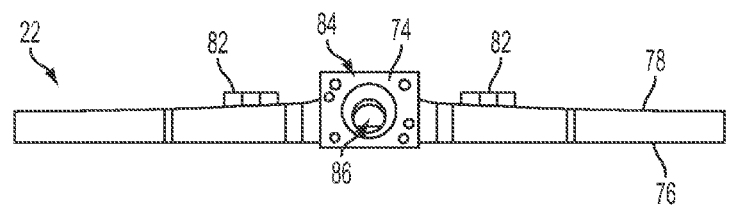
FIG. 5D is a rear plan view of the diffuser shown in FIG. 5A.
Figure 5E:
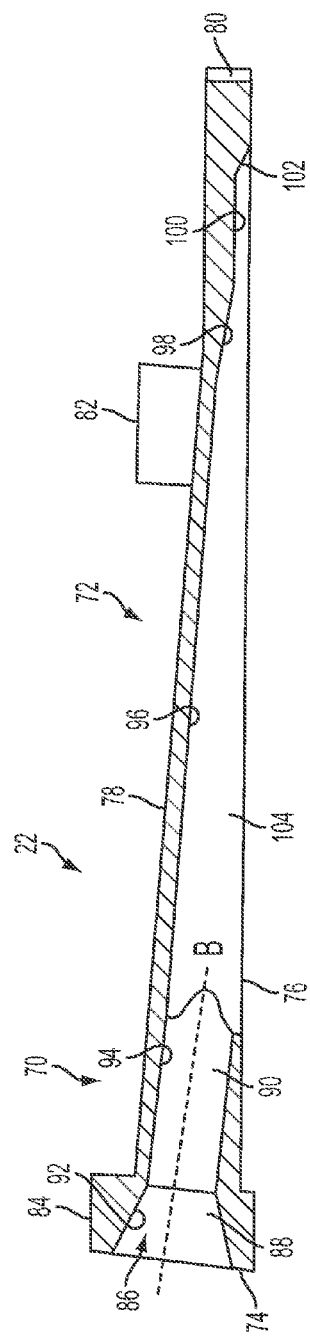
FIG. 5E is a cross-sectional view of the diffuser shown in FIG. 5C taken along the line X-X.

The inlet portion 70 of the diffuser 22 is configured to provide a pathway for the gases exiting the mixer 20 before the gases are introduced into the distribution portion 72 of the diffuser 22, as illustrated in FIGS. 5C-5E. The inlet portion 70 includes an inlet block 84 that is a substantially square member that is configured to be directly attached to the body 58 of the mixer 20, as shown in FIG. 4. The inlet block 84 includes a channel 86 formed therethrough. The channel 86 is in direct fluid communication with the chamber 60 of the mixer 20 such that the gases introduced into the mixer 20 are transferred therefrom into the channel 86 formed in the inlet block 84 of the diffuser 22. The channel 86 preferably provides a substantially linear pathway between the mixer 20 and the distribution portion 72 of the diffuser 22. The channel 86 is preferably symmetrical about a central axis B (FIG. 5E) that extends through the inlet portion 70. In an embodiment, the channel 86 is formed of a first passageway 88 and an adjacent second passageway 90, wherein the first and second passageway 88, 90 form a continuous flow pathway. The first passageway 88 is defined by a first inlet surface 92, and the second passageway 90 is defined by a second inlet surface 94.

In an embodiment, the first inlet surface 92 defining the first passageway 88 through the inlet block 84 has a substantially conical shape such that the diameter of the first inlet surface 92 is larger at a position adjacent to the mixer 20 relative to a smaller diameter at a position adjacent to the second passageway 90, as illustrated in FIG. 5E. Because the cross-sectional area of the first passageway 88 decreases in the direction of the flow path of the gases exiting the mixer 20, the flow velocity of these gases increases as the gases travel along the length of the first passageway 88. In another embodiment, the first inlet surface 92 is substantially cylindrical, thereby providing a substantially constant cross-section of the first passageway 88 along the length thereof. It should be understood by one of ordinary skill in the art that the first inlet surface 92 may be formed of any shape that may increase, decrease, or maintain a constant gas flow velocity of through the first passageway 88.

In an embodiment, the second inlet surface 94 defining the second passageway 90 through the inlet block 84 is substantially cylindrical, thereby providing a substantially constant cross-section of the second passageway 90 along the length thereof, as shown in FIG. 5E. When the first inlet surface 92 is substantially conical and the second inlet surface 94 is substantially cylindrical, the interface between the surfaces provides a transition such that the gas flow velocity through the first passageway 88 continually increases along the length thereof, whereas the gas flow velocity through the second passageway 90 remains substantially the same along the length thereof. In another embodiment, the second inlet surface 94 has a substantially conical shape (not shown) such that the diameter of the second inlet surface 94 is larger at a position adjacent to the first inlet surface 92 relative to a smaller diameter at a position adjacent to the distribution portion 72. When the first and second inlet surfaces 92, 94 are both substantially conical, these surfaces can be configures such that the first and second passageways 88, 90 provide for a continuously narrowing passageway through the inlet block 84, thereby providing a more gradual increase in flow velocity of the gases flowing therethrough. It should be understood by one of ordinary skill in the art that the second inlet surface 94 may be formed of any shape that may increase, decrease, or maintain a constant gas flow velocity through the second passageway 90. The end of the second passageway 90 opposite the first passageway 88 opens into the distribution portion 72 of the diffuser 22.

Process gases are introduced into the distribution portion 72 by way of the channel 86 formed through the inlet portion 70 extending between the mixer 20 and the distribution portion 72, as shown in FIGS. 5C-5E. In an embodiment, the distribution portion 72 includes a first distribution surface 96, a second distribution surface 98, a third distribution surface 100, and a first deflecting surface 102, and a first side surface 104 and a second side surface 106 defining the lateral boundaries of the diffuser volume 68 with a third side surface 108 extending therebetween. It should be understood by one of ordinary skill in the art that although the illustrated embodiment includes four distinct surfaces extending between the inlet portion 70 and the third side surface 108 of the distribution portion 72, there can be any number of distinct surfaces that can be combined to extend therebetween.

Figure 5F:
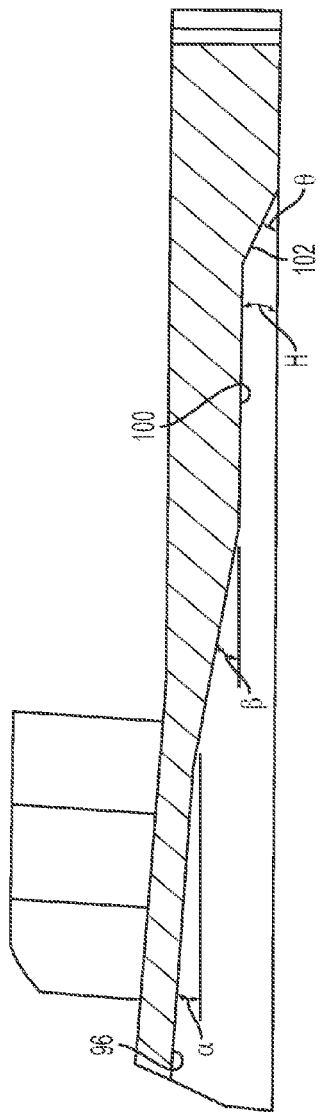
FIG. 5F is a magnified, cross-sectional view of a portion of the diffuser shown in FIG. 5E.

In the embodiment illustrated in FIGS. 5C, 5E, and 5F, the first distribution surface 96 is bounded by the inlet portion 70, the second distribution surface 98, and the first and second side surfaces 104, 106 of the distribution portion 72. In an embodiment, the first distribution surface 96 is sloped such that the distance between the first distribution surface 96 and the upper surface 62 of the top plate 24 of the reaction chamber 16 decreases in the direction from the inlet portion 70 toward the third side surface 108 of the distribution portion 72, shown as angle α in FIG. 5F. In an embodiment, the first distribution surface 96 is sloped between about 0-10°. In another embodiment, the first distribution surface 96 is sloped between about 3-7°. In yet another embodiment, the first distribution surface 96 is sloped about 4°. In an embodiment, there is no lateral slope of the first distribution surface 96 between the first and second side surfaces 104, 106. In another embodiment, the first distribution surface 96 may be sloped or curved in any manner between the first and second side surfaces 104, 106.

In the embodiment illustrated in FIGS. 5C, 5E, and 5F, the second distribution surface 98 is bounded by the first distribution surface 96, the third distribution surface 100, and the first and second side surfaces 104, 106 of the distribution portion 72. In an embodiment, the second distribution surface 98 is sloped such that the distance between the second distribution surface 98 and the upper surface 62 of the top plate 24 of the reaction chamber 16 decreases in the direction from the first distribution surface 96 toward the third side surface 108 of the distribution portion 72, shown as angle β in FIG. 5F. In an embodiment, the second distribution surface 98 is sloped between about 5-20°. In another embodiment, the second distribution surface 98 is sloped between about 7-15°. In yet another embodiment, the second distribution surface 98 is sloped about 10°. In an embodiment, there is no lateral slope of the second distribution surface 98 between the first and second side surfaces 104, 106. In another embodiment, the second distribution surface 98 may be sloped or curved in any manner between the first and second side surfaces 104, 106.

The process gases flowing through the diffuser volume 68 flow past the third diffusion surface 100 prior to flowing past the first deflecting surface 102, and the third distribution surface 100 is described in more detail below. In the embodiment illustrated in FIGS. 5C, 5E, and 5F, the first deflecting surface 102 is bounded by the third distribution surface 100 and the first, second, and third side surfaces 104, 106, 108 of the distribution portion 72. In an embodiment, the first deflecting surface 102 is sloped such that the distance between the first deflecting surface 102 and the upper surface 62 of the top plate 24 of the reaction chamber 16 decreases in the direction from the third distribution surface 100 toward the third side surface 108 of the distribution portion 72, shown as angle θ in FIG. 5F. In an embodiment, the first deflecting surface 102 is sloped between about 10-35°. In another embodiment, the first deflecting surface 102 is sloped between about 20-30°. In yet another embodiment, the first deflecting surface 102 is sloped about 26°. It should be understood by one of ordinary skill in the art that the first distribution surface 96, second distribution surface 98, and the first deflecting surface 102 can be sloped at any angle in either the longitudinal direction from the inlet portion 70 toward the third side surface 108 of the distribution portion 72 or the lateral direction from the first side surface 104 to the second side surface 106. In an embodiment, there is no lateral slope of the first deflecting surface 102 between the first and second side surfaces 104, 106. In another embodiment, the first deflecting surface 102 may be sloped or curved in any manner between the first and second side surfaces 104, 106.

In the embodiment illustrated in FIGS. 5C, 5E, and 5F, the third distribution surface 100 is bounded by the second distribution surface 98, the first deflecting surface 102, and the first and second side surfaces 104, 106 of the distribution portion 72. In an embodiment, the third distribution surface 100 is sloped in the lateral direction when the first and second distribution surfaces 96, 98 are sloped in the longitudinal direction, as described above. The third distribution surface 100 is symmetrical about a centerline 110 aligned along the longitudinal axis (FIG. 5C) of the diffuser 22. When the diffuser 22 is attached to the top plate 24 of the reaction chamber 16, the distance between the centerline 110 of the third distribution surface 100 and the upper surface 62 of the top plate 24 is between about 1.0-3.0 mm, in an embodiment. In another embodiment, the distance between the centerline 110 of the third distribution surface 100 and the upper surface 62 of the top plate 24 is between about 2.0-2.5 mm. In another embodiment, the distance between the centerline 110 of the third distribution surface 100 and the upper surface 62 of the top plate 24 is about 2.24 mm. The third distribution surface 100 is sloped in the lateral direction such that the third distribution surface 100 immediately adjacent to the first and second side surfaces 104, 106 is spaced further away from the upper surface 62 of the top plate 24 relative to the distance between the centerline 110 of the third distribution surface 100 and the upper surface 62 of the top plate 24. In an embodiment, the distance between the third distribution surface 100 immediately adjacent to the first and second side surfaces 104, 106 and the upper surface 62 of the top plate 24 is between about 3.0-5.0 mm. In another embodiment, the distance between the third distribution surface 100 immediately adjacent to the first and second side surfaces 104, 106 and the upper surface 62 of the top plate 24 is between about 3.5-4.8 mm. In yet another embodiment, the distance between the third distribution surface 100 immediately adjacent to the first and second side surfaces 104, 106 and the upper surface 62 of the top plate 24 is about 4.0 mm. The lateral slope of the third distribution surface 100 between the centerline 110 and the opposing first and second side surfaces 104, 106 may be continuous slope or may be curved such that the distance that the third distribution surface 100 is spaced apart from the upper surface 62 of the top plate 24 is non-linear between the centerline 110 and the first and second side surfaces 104, 106.

The third distribution surface 100 acts as the first gas flow restriction for the process gases as they flow through the diffuser volume 68 from the mixer 20 to the reaction chamber 16. While the first and second distribution surfaces 96, 98 provide a continually increasing lateral width between the first and second side surfaces 104, 106 as well as a continually decreasing height between the first and second distribution surfaces 96, 98 and the upper surface of the top plate 24, the third distribution surface 100 is particularly shaped to cause the process gases to become distributed laterally between the first and second side surfaces 104, 106 prior to the process gases contacting the first deflecting surface 102 and being directed toward the reaction chamber 16. In addition to laterally distributing the process gases, the third distribution surface 100 also modifies the relative gas flow velocity of the process gases across the width of the diffuser volume 68. In particular, the third distribution surface 100 of the illustrated embodiment restricts the flow of gases near the centerline 110 so as to reduce the gas flow velocity near the central axis of the diffuser 22 while providing gradually less restriction to the flow of gases laterally relative to the centerline 110. Accordingly, the flow velocity of process gases contacting the first deflecting surface 102 adjacent to the first and second side surfaces 104, 106 is greater than the flow velocity of process gases contacting the first deflecting surface 102 adjacent to the centerline 110. Thus, the velocity of process gases flowing from the diffuser 22 into the reaction chamber 16 varies across the width of the first deflecting surface 102. It should be understood by one of ordinary skill in the art that the shape of third distribution surface 100 can be shaped or sloped in any manner to provide a pre-determined gas flow velocity distribution across the width thereof, and the resulting gas flow velocity distribution produces a corresponding residence time distribution, as discussed in more detail below. It should be understood by one of ordinary skill in the art that any of the surfaces extending in the direction between the inlet portion 70 and the third side surface 108 can provide a first flow restriction that controls the relative gas flow velocities across the width of the diffuser 22.

In an embodiment, the diffuser 22 further includes a first transition surface 112 and a second transition surface 114, as illustrated in FIGS. 5B-5C. The first and second transition surfaces 112, 114 are curved surfaces that provide a transition between the laterally oriented surfaces and the vertically oriented surfaces of the distribution portion 72 of the diffuser 22. The first transition surface 112 provides a transition between the substantially vertically oriented first side surface 104 and the substantially laterally oriented first distribution surface 96, second distribution surface 98, third distribution surface 100, and first deflecting surface 102. The second transition surface 114 provides a transition between the substantially vertically oriented second side surface 106 and the substantially laterally oriented first distribution surface 96, second distribution surface 98, third distribution surface 100, and first deflecting surface 102. In another embodiment, the vertically oriented first and second side surfaces 104, 106 transitions directly with the laterally oriented first distribution surface 96, second distribution surface 98, third distribution surface 100, and first deflecting surface 102 to form an angle therebetween without an intermediate transition surface.

In an embodiment, the first and second side surfaces 104, 106 of the distribution portion 72 of the diffuser 22 are each formed of multiple sections in which each adjacent section has a different curvature in the lateral direction relative to the centerline 110 of the diffuser 22, as shown in FIG. 5C. The shape of the first and second side surfaces 104, 106 in the lateral direction can be optimized in order to reduce or eliminate recirculation of process gases as these process gases contact the first and second side surfaces 104, 106. In another embodiment, the shape of the first and second side surfaces 104, 106 between the inlet portion 70 and the third side surface 108 has a consistent curvature therebetween.

Figure 6A:
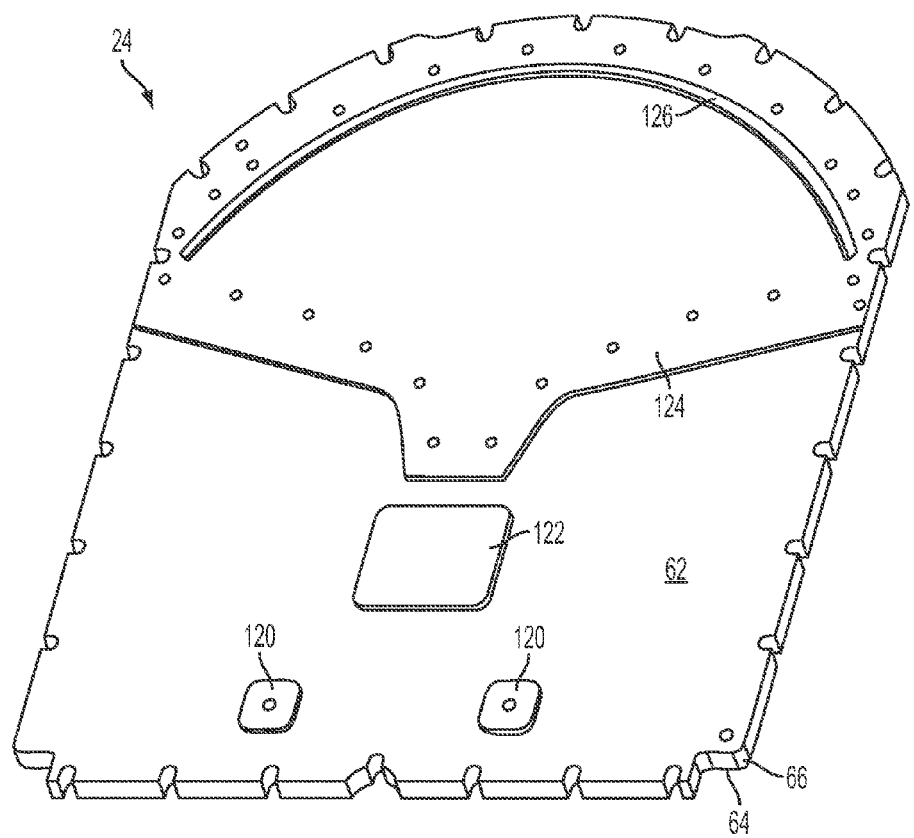
FIG. 6A is a top perspective view of an embodiment of a top plate of a reaction chamber.
Figure 6B:
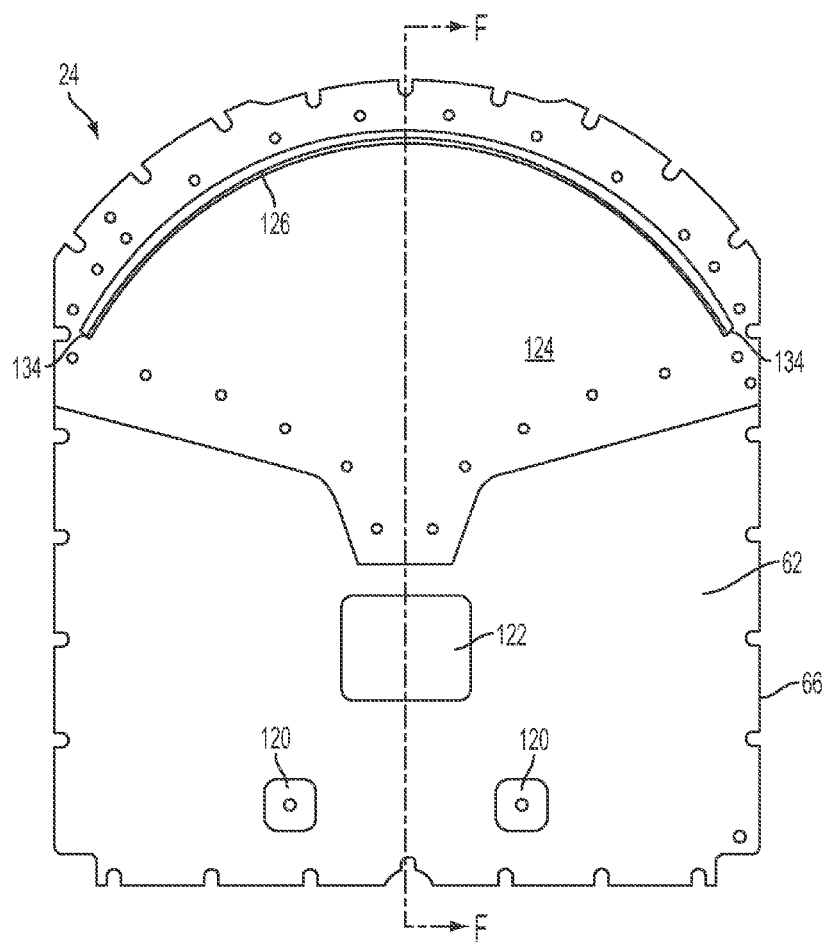
FIG. 6B is a top plan view of the top plate shown in FIG. 6A.
Figure 6C:
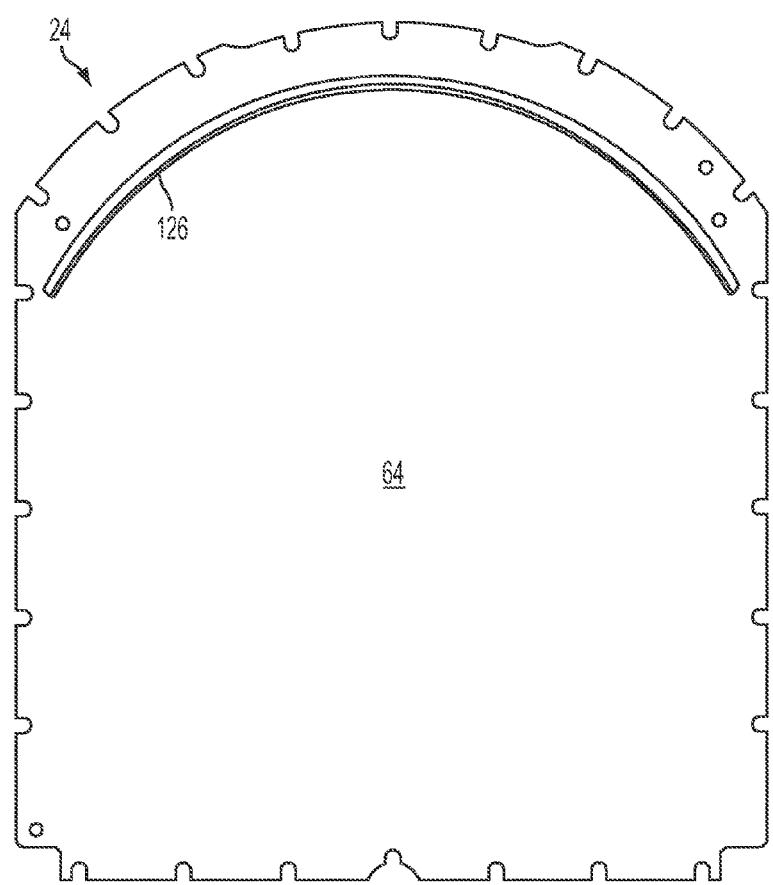
FIG. 6C is a bottom plan view of the top plate shown in FIG. 6A.

After the process gases have passed through the diffuser 22, the process gases are introduced into the reaction chamber 16 through the top plate 24, as shown in FIGS. 4 and 6A-6D. The top plate 24 includes an upper surface 62, a lower surface 64, and an edge 66 extending between the upper and lower surfaces 62, 64. The lower surface 64, as shown in FIG. 6C, is a substantially planar surface. The upper surface 62 includes a pair of raised bosses 120 extending therefrom. The upper surface 62 further includes a recessed region 122 that extends from the upper surface 62 into the thickness of the top plate 24. The recessed region 122 is configured to receive the inlet portion 70 of the diffuser 22 when the diffuser 22 is attached to the top plate 24, as shown in FIG. 4. The depth of the recessed region 122 should be sized and shaped to allow the inlet portion 70 to be disposed therein.

As shown in FIGS. 4 and 6A-6D, the top plate 24 further includes a raised surface 124. The raised surface 124 is shaped to substantially correspond to the distribution portion 72 of the diffuser 22. Thus, when the diffuser 22 is directly attached to the upper surface 62 of the top plate 24, the mounting surface 76 of the diffuser 22 is substantially aligned with the raised surface 124 of the top plate 24. It should be understood by one of ordinary skill in the art that the raised surface 124 may be sized to be slightly larger than the outline of the mounting surface 76 of the diffuser 22 to ensure the entire mounting surface 76 is in an abutting relationship with the top plate 24. The diffuser volume 68 (FIG. 4) is defined between the raised surface 124 of the top plate 24 and the first, second, and third distribution surfaces 96, 98, 100, the first deflecting surface 102, the first, second and third side surfaces 104, 106, 108, and the first and second transition surfaces 112, 114 of the diffuser 22.

The top plate 24 further includes an inlet slot 126 formed through the thickness thereof, as shown in FIGS. 4 and 6A-6E. In an embodiment, the inlet slot 126 is formed as curved slot that substantially corresponds to the third side surface 108 of the diffuser 22. In an embodiment, the shape of the inlet slot 126 generally corresponds to the leading edge of the substrate 32 to reduce the distance that the process gases must flow between the inlet slot 126 and the leading edge of the substrate 32 and also so that the distance that the gases must travel between the inlet slot 126 and the leading edge of the substrate 32 is substantially the same across the entire width of the inlet slot 126. The shape of the inlet slot 126 can be optimized in combination with the shape of the third distribution surface 100 to provide a pre-determined residence time distribution of the process gases between the inlet slot 126 and the leading edge of the substrate 32 (FIG. 4). In another embodiment, the inlet slot 126 is substantially linear. It should be understood by one of ordinary skill in the art that the inlet slot 126 can be substantially linear, curved, or any other shape, and a curved inlet slot 126 can have any radius of curvature sufficient to provide a pre-determined residence time distribution within the reaction space 28. The inlet slot 126 should be sized and shaped so as to not provide an additional flow restriction to the process gases as they flow from the diffuser 22 to the reaction space 28.

As shown in FIGS. 4 and 6D-6E, the inlet slot 126 formed through the thickness of the top plate 24 is defined by an outer surface 128, an inner surface 130, a first angled surface 132, a second angled surface 133, and a pair of corner surfaces 134 that provide a transition between the outer surface 128 and the inner and angled surfaces 130, 132, 133. In an embodiment, the outer and inner surfaces 128, 130 are substantially concentric such that the distance between these surfaces is substantially the same along the entire length of the inlet slot 126. In an embodiment, the outer and inner surfaces 128, 130 are oriented in a substantially vertical manner to provide a substantially vertical passageway between the diffuser volume 68 and the reaction space 28. In an embodiment, the inlet slot 126 is formed with only outer and inner surfaces 128, 130 without the first and second angled surfaces 132, 133. In the illustrated embodiment, the first angled surface 132 extends downwardly from the upper surface 62 of the top plate 24. The first angled surface 132 provides a transition surface so that the process gases exiting the diffuser volume 68 into the inlet slot 126 do not traveling at a right angle. Instead, the first angled surface 132 allows the flow of gases to slowly transition from a substantially horizontal flow direction to a substantially vertical flow direction, thereby avoiding abrupt transitions that can create turbulent eddies, vortices, or recirculation that entrains the flow of process gases and can cause chemical vapor deposition growth modes in these localized areas.

The inner surface 130 surface extends in a substantially vertical manner between the first angled surface 132 and the second angled surface. In the embodiment shown in FIGS. 4 and 6D-6E, the second angled surface 133 extends upwardly from the lower surface 64 of the top plate 24 at an angle. The second angled surface 133 provides a transition surface so that the gases exiting the inlet slot 126 into the reaction space 28 do not traveling at a right angle which may cause turbulence problems noted above. Instead, the second angled surface 133 allows the flow of gases to slowly transition from a substantially vertical flow direction to a substantially horizontal flow direction. The first and second angled surfaces 132, 133 reduce the likelihood of recirculation or turbulence within the inlet slot 126. It should be understood by one of ordinary skill in the art that the first and second angled surfaces 132, 133 can be formed at any angle relative to the upper and lower surfaces 62, 64 of the top plate 24.

Figure 1A:
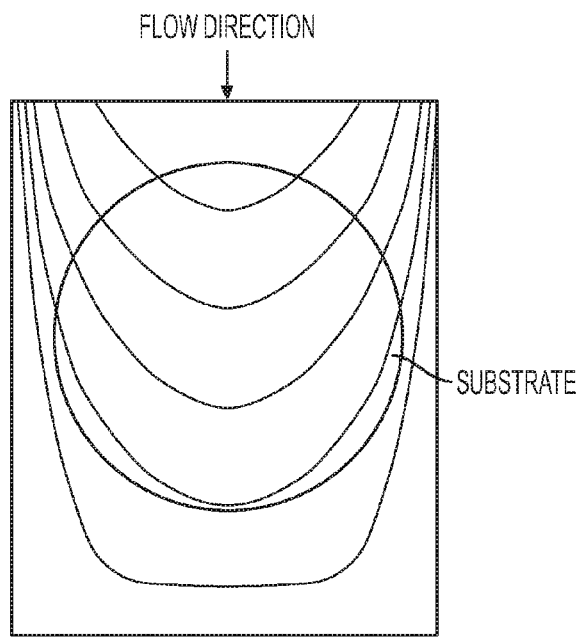
FIG. 1A is a diagram of the residence time distribution of process gases through a reaction chamber commonly used in the art.
Figure 1B:
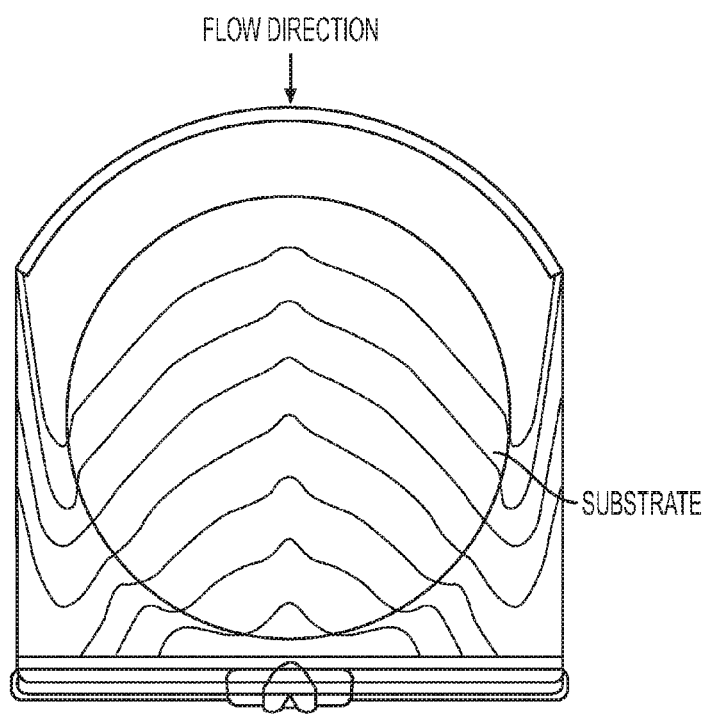
FIG. 1B is a diagram of a preferred residence time distribution of process gases through a reaction chamber.

In operation, the process gases flow through the diffuser 22 where the flow of the gases is restricted between the third distribution surface 100 and the upper surface 62 of the top plate 24, and the process gases are then introduced into the reaction chamber 16 through the inlet slot 126. The third distribution surface 100 is configured to modify the gas flow velocity of the process gases across the width of the diffuser 22 relative to the centerline 110 thereof. Thus, as the process gases enter the inlet slot 126, the gas flow velocity of the process gases across the width of the inlet slot 126 likewise varies. In an embodiment, the varied gas flow velocities in combination with the shape of the inlet slot 126 produces a residence time distribution is shaped such that the wave of process gases substantially corresponds to the shape of the leading edge of the substrate, as shown in FIG. 1B. Residence time of the process gas is the time that it takes for a fluid element to travel a given distance. The residence time distribution is the contour of constant residence time across a width. Accordingly, FIG. 1B illustrates an exemplary residence time distribution in which the shape of the residence time distribution closely corresponds with the leading edge of the substrate such that the time that it takes the process gas to flow from the inlet slot 126 to the leading edge of the substrate is constant across the width of the reaction chamber 16. The illustrated shape of the residence time distribution is a result of the gas flow velocities exiting the inlet slot 126 at a higher gas flow velocity near the opposing side edges of the reaction chamber with respect to a lower gas flow velocity near the centerline of the reaction chamber. Although the overall distance between the inlet slot 126 and the leading edge of the substrate is nearly the same across the width of the reaction chamber, the fluid dynamics within the reaction space 28 requires such a pre-determined gas flow velocity distribution to produce such a shaped residence time distribution. FIG. 1B illustrates only an exemplary embodiment of a residence time distribution resulting from the restriction to the gas flow caused by the third distribution surface 100 of the diffuser 22, but it should be understood by one of ordinary skill in the art that the third distribution surface 100 —or any other surface of the diffuser configured to provide a gas flow restriction— can be modified to produce a pre-determined residence time distribution. In another embodiment, the third distribution surface 100 is shaped such that the resulting gas flow velocity distribution across the width of the inlet slot 126 produces a residence time distribution that has a substantially flat shape that it "center heavy"—or, in other words, the shape of the residence time distribution corresponds to the shape of the trailing edge of the substrate.

Figure 7A:
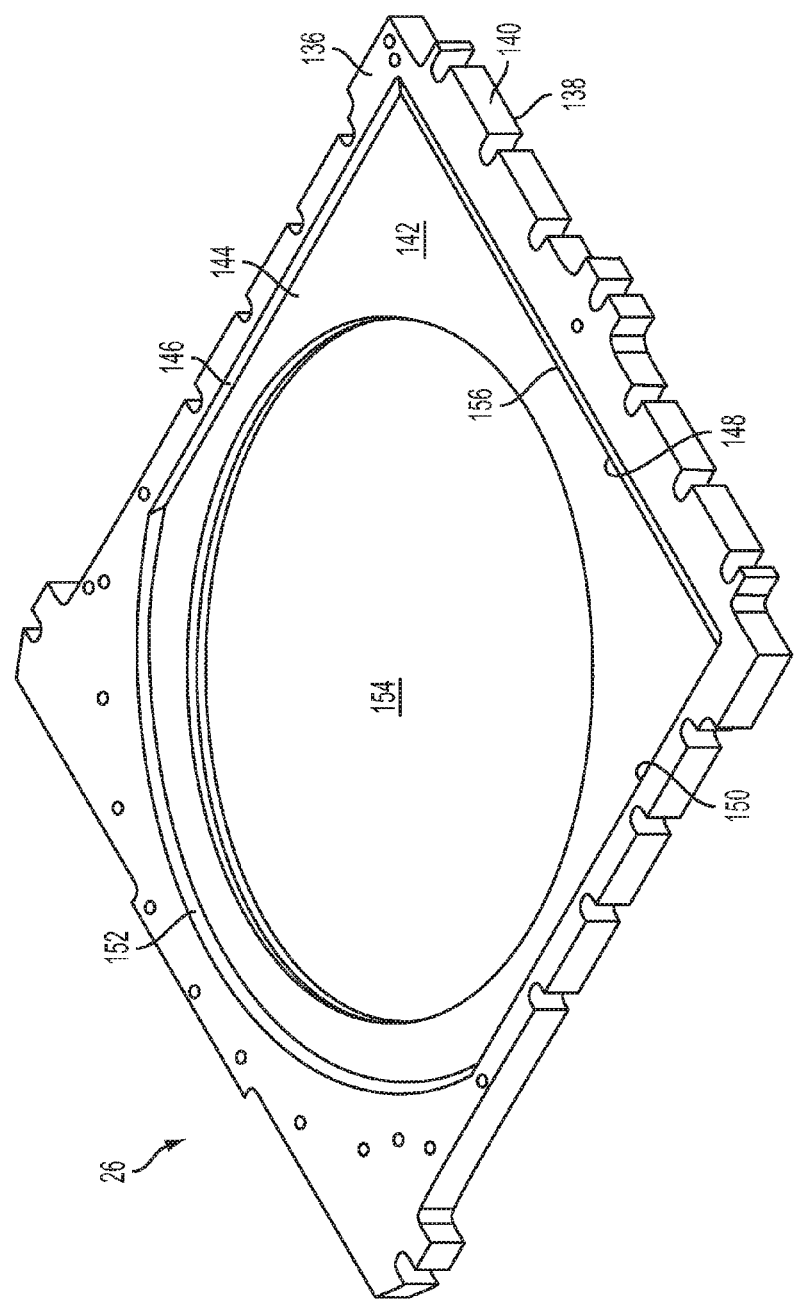
FIG. 7A is a top perspective view of an embodiment of a bottom plate of a reaction chamber.
Figure 7B:
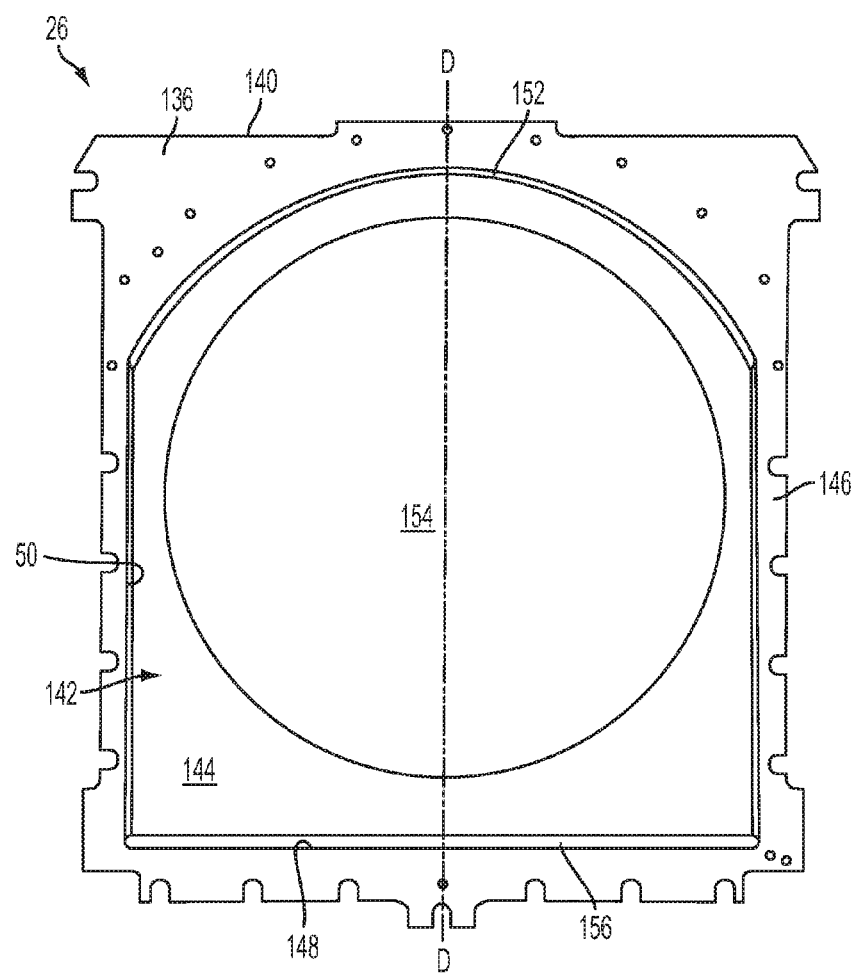
FIG. 7B is a top plan view of the bottom plate shown in FIG. 7A.
Figure 7C:
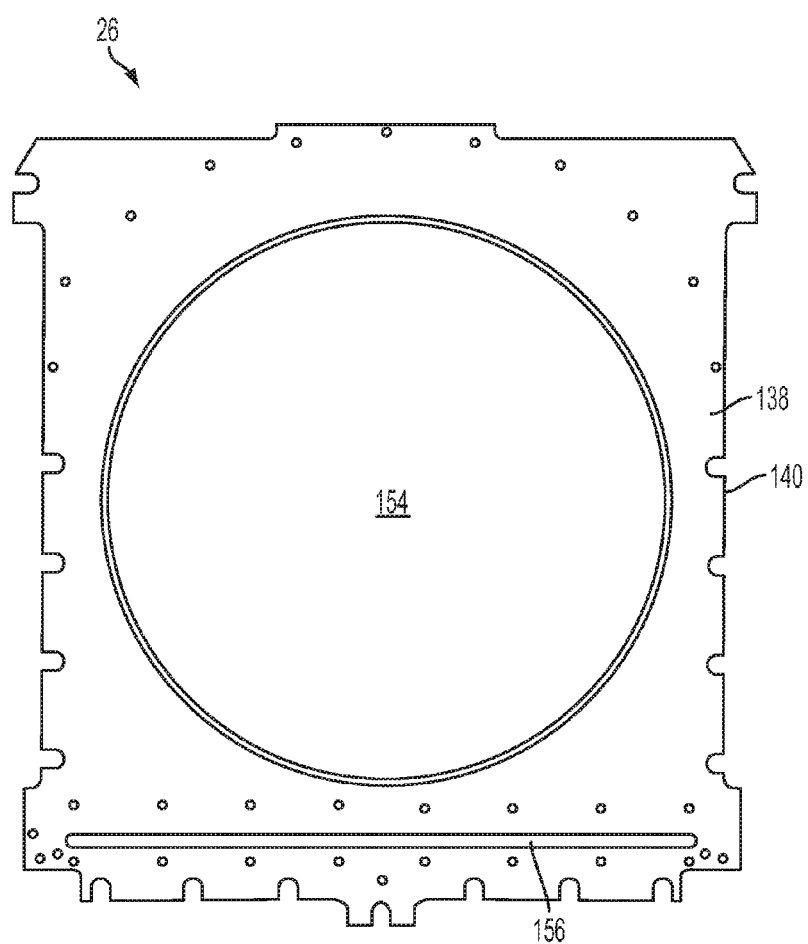
FIG. 7C is a bottom plan view of the bottom plate shown in FIG. 7A.

The top plate 24 is attached to the bottom plate 26 to form a reaction chamber 16 with a reaction space 28 formed between the top and bottom plates 24, 26, as shown in FIG. 4. As illustrated in FIGS. 7A-7C, the bottom plate 26 is a substantially flat member having an upper surface 136, a lower surface 138, and an edge 140 extending between the upper and lower surfaces 136, 138. The bottom plate 26 includes a recessed region 142 formed of a recessed surface 144, a first side edge 146, a second side edge 148, a third side edge 150, and a second deflecting surface 152, wherein the first, second, third side edges 146, 148, 150 and the second deflecting surface 152 extend between the recessed surface 144 and the upper surface 136 of the bottom plate 26. In an embodiment, the first, second, and third side edges 146, 148, 150 extend in a substantially linear manner between the upper surface 136 and the recessed surface 144, wherein the transition between the side edges 146, 148, 150 and the recessed surface 144 is generally at a right angle. In another embodiment, the first, second, and third side edges 146, 148, 150 extend from the upper surface 136 in a generally vertical manner but may include a slight radius of curvature for a transition between the side edges 146, 148, 150 and the recessed surface 144. It should be understood by one of ordinary skill in the art that the first, second, and third side edges 146, 148, 150 can be oriented in any manner as they extend between the upper surface 136 and the recessed surface 144 of the bottom plate 26.

Figure 7D:
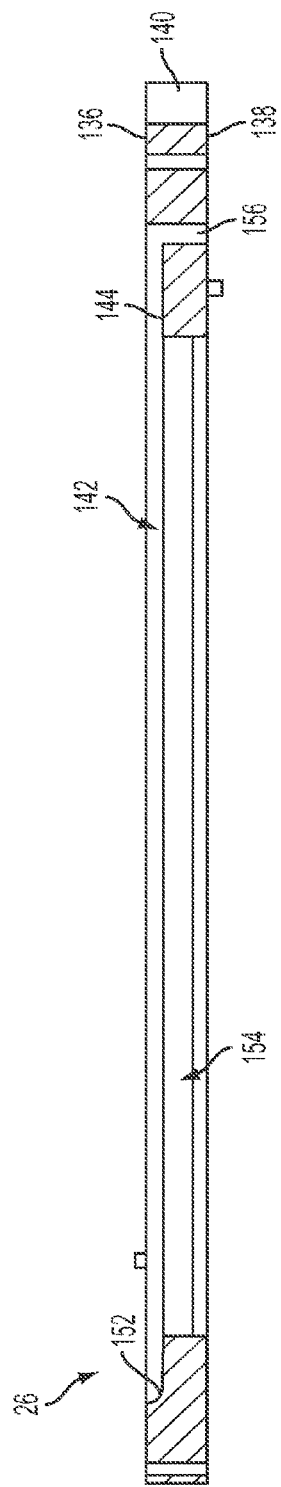
FIG. 7D is a cross-sectional view of the bottom plate shown in FIG. 7B taken along line D-D'.

The second deflecting surface 152 extends between the upper surface 136 and the recessed surface 144 of the bottom plate 26, as illustrated in FIGS. 4, 7B, and 7D. The second deflecting surface 152 is curved in both the lateral and vertical directions. In an embodiment, the second deflecting surface 152 is arced in the lateral direction about the longitudinal centerline of the bottom plate 26, wherein the arced shape of the second deflecting surface 152 substantially corresponds to the arced shape of the inlet slot 126 formed through the top plate 24. It should be understood by one of ordinary skill in the art that the radius of curvature of the second deflecting surface 152 in the lateral direction should correspond to the radius of curvature of the inlet slot 126 formed through the top plate 24 as well as the radius of curvature of the first deflecting surface 102 of the diffuser 22. In an embodiment, the second deflecting surface 152 is a curved surface that extends between the first and third sided edges 146, 150 of the recessed region 142. The second deflecting surface 152 provides a curved surface between the upper surface 136 of the 136 of the bottom plate 26 and the recessed surface 144 to redirect the process gases from a substantially vertical flow direction through the inlet slot 126 to a substantially horizontal flow direction through the reaction space 28. It should be understood by one of ordinary skill in the art that the radius of curvature and the overall length of the second deflecting surface 152 between the upper surface 136 and the recessed surface 144 may be any angle or length sufficient to allow the process gases to change flow direction without a significant amount of turbulence or recirculation of the gases.

The bottom plate 26 also includes an aperture 154 formed therethrough, as shown in FIGS. 7A-7D. The aperture 154 extends between the recessed surface 144 and the lower surface 138 of the bottom plate 26. The aperture 154 is configured to receive a susceptor 30 (FIG. 4) carrying a substrate 32 to be processed within the reaction chamber 16. In operation, the susceptor 30 is withdrawn, or lowered so as to receive a substrate 32 that is inserted into the housing 12. Once the substrate 32 has been seated on the susceptor 30, the susceptor 30 is raised into the aperture 154 to a processing position in which the susceptor 30 is positioned near or in contact with the bottom plate 26. After the substrate 32 has been processed, the susceptor 30 is lowered away from the aperture 154 and the cycle is repeated with another substrate 32.

Process gases are introduced into the reaction space 28 through the inlet slot 126 adjacent the second deflecting surface 152 of the bottom plate 26 and exit the reaction space 28 through an exhaust slot 156 formed adjacent the second side edge 148 of the recessed region 142 of the bottom plate 26, as shown in FIGS. 4 and 7A-7D. The exhaust slot 156 is an elongated slot extending between the recessed surface 144 and the lower surface 138 of the bottom plate 26. In an embodiment, the exhaust slot 156 extends the entire distance laterally between the first and third side edges 146, 150 of the recessed region 142. In another embodiment, the exhaust slot 156 extends laterally only a portion of the distance between the first and third side edges 146, 150. In an embodiment, the exhaust slot 156 is symmetrical about the longitudinal axis of the bottom plate 26. It should be understood by one of ordinary skill in the art that the exhaust slot 156 can have any length or width sufficient to allow process gases to exit the reaction space 28 between the top and bottom plates 24, 26. The exhaust slot 156 should be configured such that it does not provide a restriction to the flow of gases therethrough but can assist the gas delivery system 14 in overall control of the residence time distribution at the leading edge of substrate by tuning the conductance profile through the exhaust assembly 18. The process gases exit the reaction chamber 16 through the exhaust slot 156 and are then received in the exhaust assembly 18.

In the embodiment illustrated in FIGS. 2-4, the exhaust assembly 18 is operatively connected to the bottom plate 26 of the reaction chamber 16. In an embodiment, the exhaust assembly 18 includes an exhaust shim 158, an exhaust launder 160, and piping that transports the process gases and effluent from the exhaust launder 160 out of the housing 12. When assembled, the exhaust shim 158 is disposed between the exhaust launder 160 and the lower surface 138 of the bottom plate 26, and the exhaust assembly 18 is attached directly to the reaction chamber 16.

Figure 8:
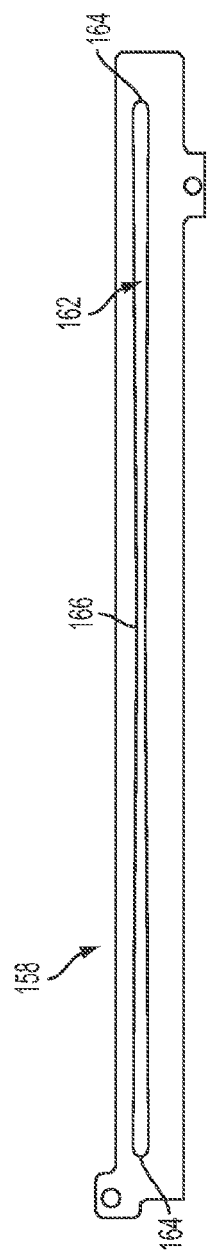
FIG. 8 is a top plan view of an embodiment of an exhaust shim.

As shown in FIG. 8, the exhaust shim 158 includes an elongated restriction slot 162 formed therethrough. The exhaust shim 158 provides a second restriction to the flow of process gases. In an embodiment, the length of the restriction slot 162 substantially corresponds to the length of the exhaust slot 156 formed through the bottom plate 26. The restriction slot 162 is formed such that the slot is a bow-tie shape. In other words, the width of the restriction slot 162 is larger at the opposing ends 164 of the restriction slot 162 relative to a narrower width at the midpoint 166 of the restriction slot 162. Given a substantially consistent flow velocity of process gases along the width of the exhaust slot 156, the shape of the restriction slot 162 provides increased flow restriction to the process gases through the midpoint 166 of the restriction slot 162 relative to lesser flow restriction to the process gases near the ends 164 of the restriction slot 162. Accordingly, the gas flow velocity near the midpoint 166 of the restriction slot 162 is less than the gas flow velocity near the ends 164 of the restriction slot 162 as is exit the exhaust shim 158. As a result, this second gas flow restriction in combination with the gas flow restriction caused by the third distribution surface 100 of the diffuser 22 results in a residence time distribution through the reaction chamber 16 that closely corresponds to the shape of the entire leading edge of the substrate 32 being processed.

When the top and bottom plates 24, 26 are assembled to form the reaction chamber 16, as illustrated in FIG. 4, the reaction space 28 is defined between the recessed region 142 of the bottom plate 26, the susceptor 30, and the lower surface 64 of the top plate 24. The reaction space 28 provides a volume through which process gases can travel between the inlet slot 126 and the exhaust slot 156. Within the reaction space 28, the process gases contact the substrate 32 to deposit a layer of material on the substrate 32. The effluent—or the byproducts of the chemical reaction on the surface of the substrate—and any unreacted process gas is withdrawn from the reaction chamber 16 through the exhaust slot 156.

As shown in FIG. 6E, when the diffuser 22 is attached to the assembled reaction chamber 16, the edge formed at the junction of the outer surface 128 of the inlet slot 126 and the upper surface 62 of the top plate 24 is positioned immediately adjacent to the mounting surface 76 of the diffuser 22. As a result, the edge formed at the junction of the third side surface 108 and the mounting surface 76 of the diffuser 22 is positioned within the gap defining the inlet slot 126 formed in the top plate 24 such that the edge of the diffuser 22 is not aligned with the corresponding edge of the inlet slot 126.

Similarly, when the top plate 24 is attached to the bottom plate 26 to form the reaction chamber 16, the edge of the recessed region 142 formed between the second deflecting surface 152 and the upper surface 136 of the bottom plate 26 is positioned just slightly beyond the outer surface 128 of the inlet slot 126 of the top plate 24 such that the edge of the recessed region 142 positioned adjacent to the inlet slot 126 contacts the lower surface 64 of the top plate 24. As a result, the edge formed by the junction of the outer surface 128 and the lower surface 64 of the top plate 24 is positioned above the recessed region 142 of the bottom plate 26. Thus, the edge of the diffuser 22 is slightly offset relative to the corresponding edge of the inlet slot 126, and the edge of the inlet slot 126 is slightly offset relative to the corresponding edge of the recessed region 142 of the bottom plate. These offset edges provide a cascading flow effect as the process gases transition from the diffuser volume 68 to the inlet slot 126 to the reaction space 28, wherein flow of gases makes a generally u-turn change in flow direction. The cascading flow effect reduces or eliminates the recirculation of process gases that may otherwise occur if the corresponding edges of the diffuser 22, top plate 24, and bottom plate 26 are not properly aligned. Because the first gas flow restriction is moved upstream from the inlet slot 126 such that the inlet slot 126 does not act as a gas flow restriction, the disassembly of diffuser 22 and the reaction chamber 16 is simplified. As a result, the ease of disassembly allows for a more direct line-of-sight for cleaning or adding surface texturing to the surfaces of the diffuser 22 and reaction chamber 16.

In an embodiment, the entire gas delivery system 14 including the gas lines, the mixer 20, and the diffuser 22, as well as the top and bottom plates 24, 26 of the reaction chamber are formed of stainless steel. It should be understood by one of ordinary skill in the art that the gas lines, the mixer, and/or the diffuser 22 may also be formed of titanium, aluminum, an alloy, or any material that is inert with respect to the process gases used in substrate processing. The mixer 20, the diffuser 22, the top plate 24, and the bottom plate 26 all include surfaces that are contacted by process gases flowing from the gas lines to the exhaust assembly 18. Each of the surfaces that contact the process gases is a wetted surface, meaning that at least a portion of the entire surface is exposed to process gases as the process gases flow through the entire system. With respect to the mixer 20, the surface defining the chamber 60 is a wetted surface as it contacts process gases. With respect to the diffuser 22, the first and second inlet surfaces 92, 94 that form the channel 86 through the inlet portion 70 are wetted surfaces. Additionally, each of the surfaces defining the diffuser volume 68 is also a wetted surface. These wetted surfaces of the diffuser volume 68 includes: the first, second, and third distribution surfaces 96, 98, 100, the first deflecting surface 102, the first, second, and third side surfaces 104, 106, 108, the first and second transition surfaces 112, 114, and at least a portion of the raised surface 124 of the top plate 24. With respect to the inlet slot 126, the outer surface 128 as well as the first and second angled surfaces 132, 133 and the inner surface 130 are also wetted surfaces. With respect to the reaction chamber 16, all of the surfaces defining the reaction space 28 are wetted surfaces. The wetted surfaces of the reaction space 28 include: at least a portion of the lower surface 64 of the top plate 24 exposed by the recessed region 142 as well as the recessed surface 144, the first, second, and third side edges 146, 148, 150, and the second deflecting surface 152.

During processing of a substrate 32, as the process gases are introduced into the gas delivery system 14 and the reaction chamber 16, the process gases react with the wetted surface in a similar manner as the surface of the substrate 32 being processed. After each cycle of an ALD process, approximately a monolayer of material is deposited on the exposed surface of the substrate 32 as well as all of the wetted surfaces of the gas delivery system 14 and the reaction chamber 16. If the wetted surface has very little surface roughness, the deposited layers of material do no remain adhered to the wetted surfaces and tend to flake off the wetted surfaces with film accumulation. The flaking deposition layers can then land on the surface of substrates, thereby affecting the overall deposition uniformity on the substrate as well as result in less surface area of a substrate that can yield viable chips. However, if the wetted surface has too high a surface roughness, the total surface area of the wetted surface is increased by such an amount that the concentration of the process gases is reduced significantly due to the precursor materials in the process gases adhering to the wetted surfaces prior to the process gases reaching the substrate 32 being processed. Accordingly, the present invention provides a surface texturing to each of the wetted surfaces, wherein the surface texturing provides a surface roughness to each of the wetted surfaces such that the amount of flaking off of layers of deposited materials is reduced and the concentration of precursor material in the process gases that eventually contact the substrate surface is not significantly reduced by adsorption onto the wetted surfaces. Because ALD is a surface-sensitive process, the amount and degree of surface texturing should be optimized to balance the reduction in film stress caused by flaking and de-adhesion on the wetted surfaces with the chemical loss due to adsorption of the precursor on the wetted surfaces.

In an embodiment, the surface roughness of all the wetted surfaces is between about 30-250 Ra (or pinches). In another embodiment, the surface roughness of all of the wetted surfaces is between about 32-110 Ra. In yet another embodiment, the surface roughness of all of the wetted surfaces is about 90 Ra. The surface roughness of the wetted surfaces of the mixer 20, diffuser 22, and the reaction chamber 16 is done through a multiple-step process that may utilize both physical and chemical contact with the wetted surfaces.

Surface texturing is any technique used to treat a surface such that the vertical deviations from an ideal surface are largely controlled. Surface texturing can be accomplished by a variety of techniques including mechanical (i.e., grit or bead blasting, sanding, or machining to remove material) or coating a surface with a similar or dissimilar but compatible material to raise the surface from the starting surface (i.e., spray coating, powder coating, dipping, evaporation coating, spin-on coats, or the like).

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A gas delivery system for delivering at least one process gas to a reaction chamber, the gas delivery system comprising:
a diffuser in fluid communication with said reaction chamber, said diffuser being attached directly to an upper surface of said reaction chamber, wherein a diffuser volume for distributing said at least one process gas is defined between said diffuser and said upper surface of said reaction chamber, and wherein said reaction chamber comprises opposing side edges and a centerline, wherein said diffuser comprises a plurality of distribution surfaces, a deflecting surface, a first curved side surface, a second curved side surface, and a third curved side surface, wherein the third curved side surface comprises a curve in a lateral direction, and
wherein said diffuser comprises an increasing lateral width between the first curved side surface and the second curved side surface, wherein a first and a second distribution surface of the plurality of distribution surfaces are sloped downwards at different angles relative to the upper surface, wherein a third distribution surface of the plurality of distribution surfaces is sloped in a lateral direction with respect to a main flow direction along the centerline to cause the at least one process gas to become distributed laterally between the first curved side surface and the second curved side surface prior to the at least one process gas contacting the deflecting surface, and wherein said upper surface comprises a curved inlet slot substantially corresponding to said third curved side surface, wherein gas flow velocities exiting the inlet slot are higher near the opposing side edges relative to a lower gas flow velocity near the centerline.

2. The gas delivery system of claim 1, wherein at least one distribution surface of the plurality of distribution surfaces is configured to restrict flow of said at least one process gas such that the at least one distribution surface reduces flow near a central axis of the diffuser and relative to flow at a lateral distance away from the centerline of the diffuser.

3. The gas delivery system of claim 2, wherein at least a portion of said at least one distribution surface is spaced a first distance away from said upper surface of said reaction chamber and another portion of said at least one distribution surface is spaced a second distance away from said upper surface of said reaction chamber.

4. The gas delivery system of claim 3, wherein said second distance is greater than said first distance.

5. The gas delivery system of claim 3, wherein said first distance is less than said second distance, and said first distance is measured between a centerline of said at least one distribution surface and said upper surface of said reaction chamber.

6. The gas delivery system of claim 5, wherein said first distance is between about 2.0 mm and 2.5 mm.

7. The gas delivery system of claim 6, wherein said first distance is about 2.24 mm.

8. The gas delivery system of claim 5, wherein said second distance is between about 3.5 mm and 4.8 mm.

9. The gas delivery system of claim 8, wherein said second distance is about 4.0 mm.

10. The gas delivery system of claim 1, wherein said first curved side surface comprises a first curvature and an adjacent second curvature, wherein said first curvature is different than said second curvature.

11. The gas delivery system of claim 1, wherein said diffuser comprises the first distribution surface, the second distribution surface, and the third distribution surface, wherein said first, second, and third distribution surfaces and the deflecting surface extend laterally between the first curved side surface and the second curved side surface, and wherein said first and second curved side surfaces extend between said first, second, and third distribution surfaces and the deflecting surface and a mounting surface.

12. The gas delivery system of claim 1, wherein said diffuser comprises the deflecting surface adjacent one of the plurality of distribution surfaces.

13. The gas delivery system of claim 1, wherein a shape of the first and second curved side surface is designed to reduce recirculation of process gasses.

14. The gas delivery system of claim 1, wherein said diffuser is fan-shaped.

15. The gas delivery system of claim 1, wherein said diffuser comprises a plurality of distribution surfaces.

* * * * *